US010600815B2

(12) United States Patent
Koide

(10) Patent No.: US 10,600,815 B2
(45) Date of Patent: Mar. 24, 2020

(54) DISPLAY DEVICE

(71) Applicant: Japan Display Inc., Minato-ku (JP)

(72) Inventor: Gen Koide, Tokyo (JP)

(73) Assignee: Japan Display Inc., Minato-ku (JP)

( * ) Notice: Subject to any disclaimer, the term of this patent is extended or adjusted under 35 U.S.C. 154(b) by 292 days.

(21) Appl. No.: 15/659,753

(22) Filed: Jul. 26, 2017

(65) Prior Publication Data

US 2018/0033800 A1 Feb. 1, 2018

(30) Foreign Application Priority Data

Jul. 29, 2016 (JP) .................................. 2016-149969

(51) Int. Cl.
G02F 1/1335 (2006.01)
H01L 27/12 (2006.01)
G02F 1/1333 (2006.01)
G06F 3/041 (2006.01)

(52) U.S. Cl.
CPC ...... H01L 27/124 (2013.01); G02F 1/133305 (2013.01); G02F 1/133514 (2013.01); G06F 3/041 (2013.01); G02F 1/13336 (2013.01); G02F 1/133512 (2013.01)

(58) Field of Classification Search
CPC ......... G02F 1/133514; G02F 1/133305; G02F 2001/133302; H01L 27/124; G06F 3/041
See application file for complete search history.

(56) References Cited

U.S. PATENT DOCUMENTS

| | | | | |
|---|---|---|---|---|
| 6,392,736 | B1* | 5/2002 | Furukawa | G02F 1/13394 349/156 |
| 2007/0069630 | A1* | 3/2007 | Kijima | H01J 29/90 313/495 |
| 2012/0062505 | A1* | 3/2012 | Kim | B82Y 15/00 345/174 |
| 2014/0014990 | A1* | 1/2014 | Kim | H01L 35/58 257/98 |
| 2018/0035542 | A1* | 2/2018 | Osawa | H05K 1/144 |
| 2018/0213638 | A1* | 7/2018 | Osawa | G02F 1/13338 |
| 2018/0321563 | A1* | 11/2018 | Nakamura | G02F 1/136286 |

FOREIGN PATENT DOCUMENTS

| | | |
|---|---|---|
| JP | 2002-040465 | 2/2002 |
| JP | 2007-011030 | 1/2007 |

* cited by examiner

*Primary Examiner* — James A Dudek
(74) *Attorney, Agent, or Firm* — Oblon, McClelland, Maier & Neustadt, L.L.P.

(57) ABSTRACT

According to one embodiment, a display device includes a first substrate including a first basement, a scanning line and a signal line, arranged in a display area, a switching element arranged in the display area and electrically connected to the scanning line and the signal line, and a first conductive layer arranged in a periphery region surrounding the display area and formed from a material different from that of the scanning line, a second substrate including a second basement opposing the first conductive layer and spaced therefrom, and a second conductive layer, and includes a first hole which penetrates the second basement, and a connecting material electrically connecting the first conductive layer and the second conductive layer via the first hole.

19 Claims, 17 Drawing Sheets

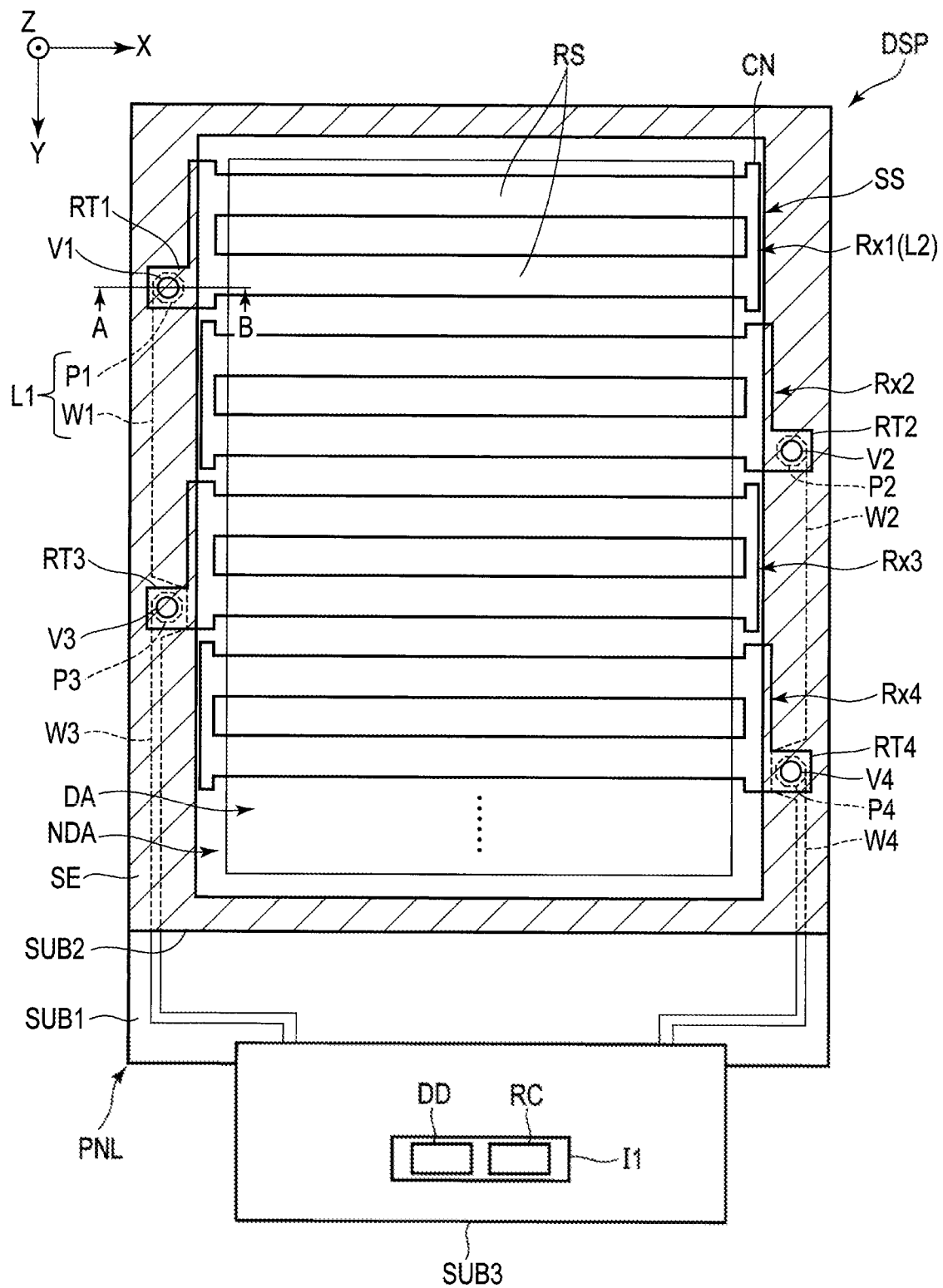
F I G. 1

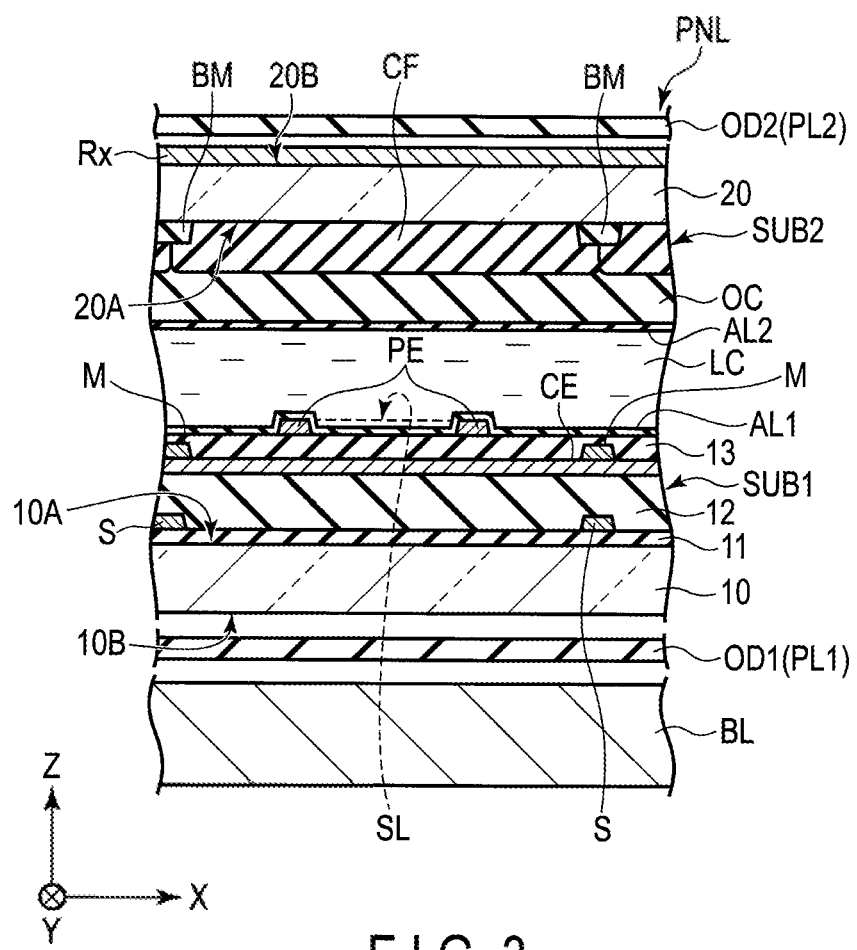
F I G. 3

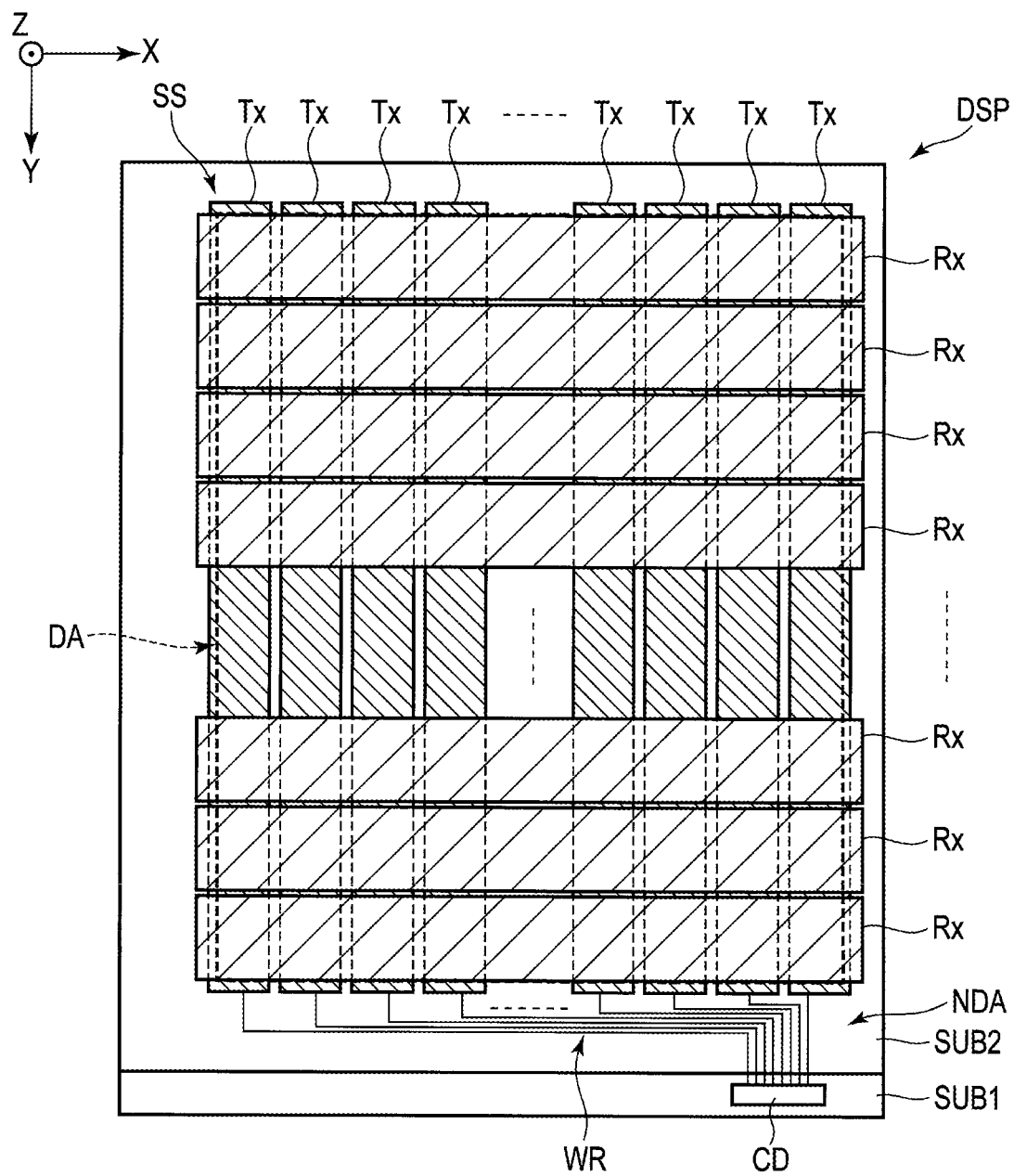
F I G. 5

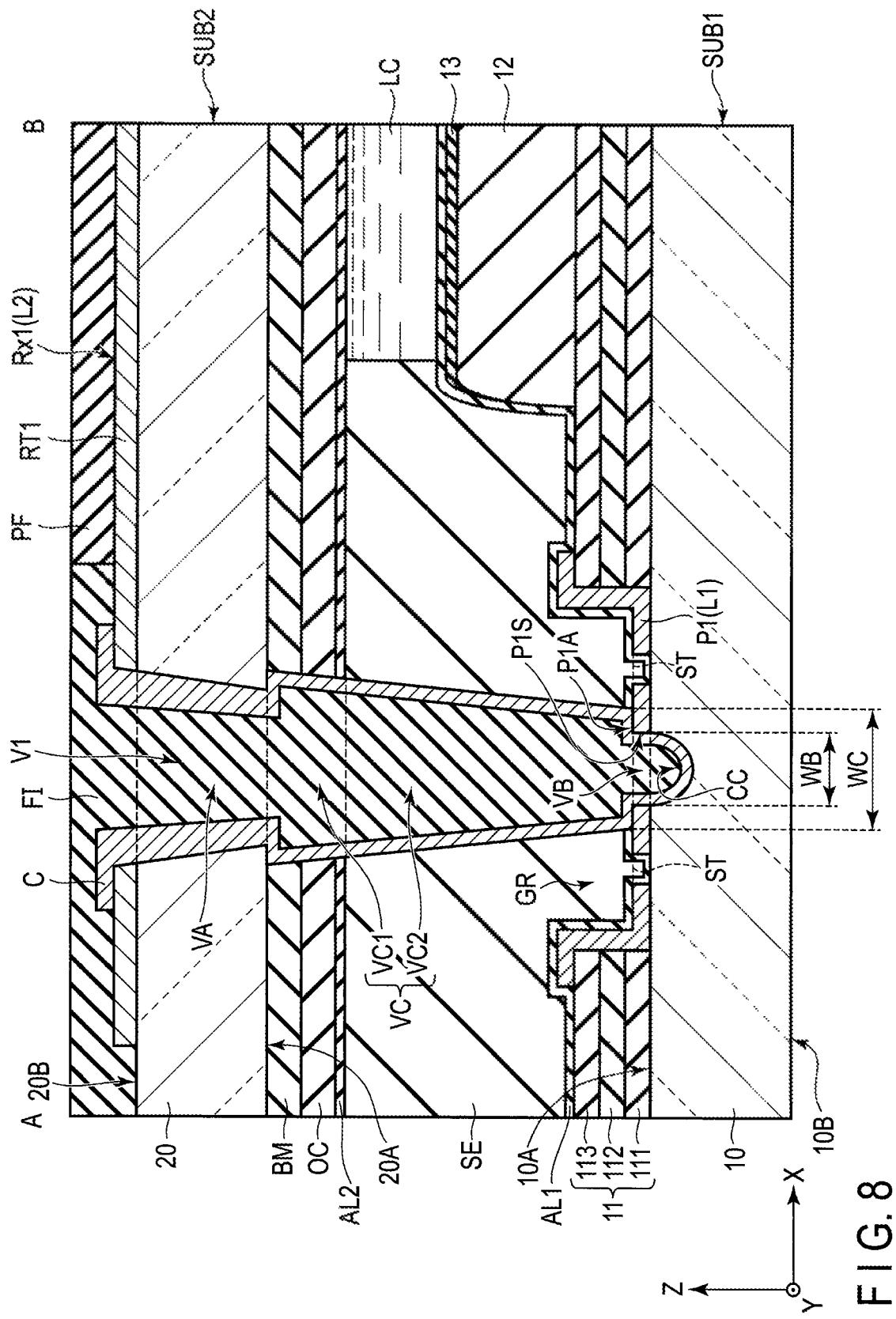
F I G. 8

DISPLAY DEVICE

CROSS-REFERENCE TO RELATED APPLICATIONS

This application is based upon and claims the benefit of priority from Japanese Patent Application No. 2016-149969, filed Jul. 29, 2016, the entire contents of which are incorporated herein by reference.

FIELD

Embodiments described herein relate generally to a display device.

BACKGROUND

In recent years, various techniques for reducing the width of the frame in display devices have been studied. One example discloses a technique of utilizing an inter-substrate connecting material which electrically connects a wiring portion comprising a connecting material inside a hole which penetrates an inner surface and an outer surface of a resin-made first substrate, and a wiring portion provided on an inner surface of a resin-made second substrate to each other.

BRIEF DESCRIPTION OF THE DRAWINGS

FIG. 1 is a plan view schematically showing a display device to according to an embodiment.

FIG. 3 is a cross section schematically showing a display area of the display device shown in FIG. 1.

FIG. 5 is a plan view schematically showing a sensor mounted in the display device shown in FIG. 1.

FIG. 8 is a cross section schematically showing a non-display area of the display device shown in FIG. 1.

DETAILED DESCRIPTION

Figure 2:
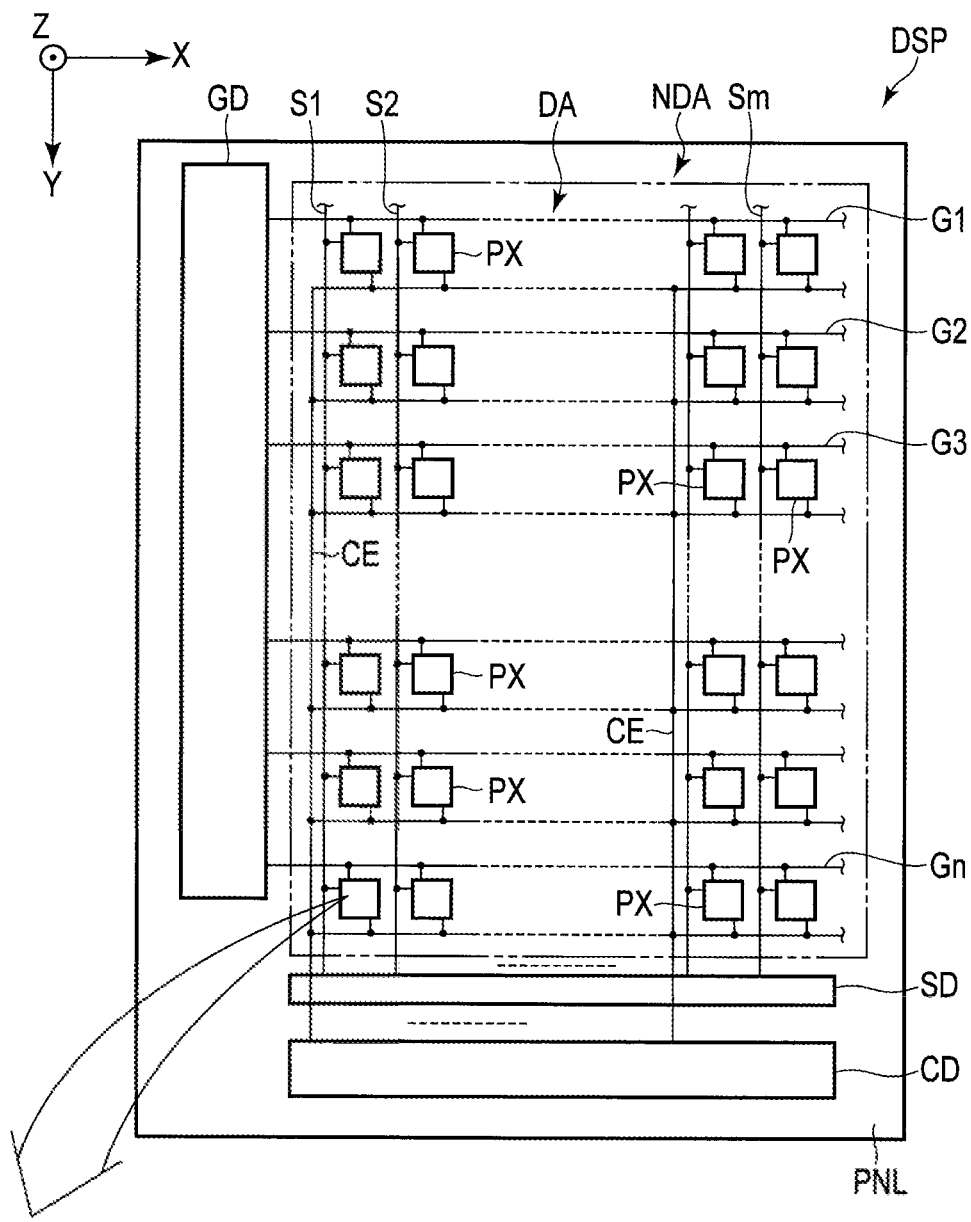
FIG. 2 is an equivalent circuit of the display device shown in FIG. 1.
Figure 2:
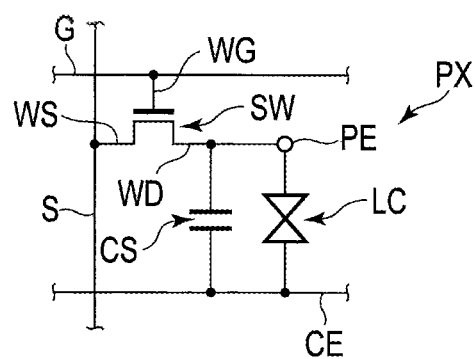

In general, according to one embodiment, a display device comprises a first substrate including a first basement, a scanning line and a signal line, arranged in a display area which displays images, a switching element arranged in the display area and electrically connected to the scanning line and the signal line, and a first conductive layer arranged in a periphery region surrounding the display area and formed from a material different from that of the scanning line, a second substrate including a second basement opposing the first conductive layer and spaced therefrom, and a second conductive layer, and comprising a first hole which penetrates the second basement, and a connecting material electrically connecting the first conductive layer and the second conductive layer via the first hole.

Embodiments will be described hereinafter with reference to the accompanying drawings. Incidentally, the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the structural elements having functions, which are identical or similar to the functions of the structural elements described in connection with preceding drawings, are denoted by like reference numerals, and an overlapping detailed description is omitted unless otherwise necessary.

The display device of this embodiment can be used in various devices such as smartphones, tablet computers, mobile phones, notebook computers, and game consoles. The main structure described in the present embodiment is applicable to a liquid crystal display device, a self-luminous display device such as an organic electroluminescent display device, an electronic paper display device comprising an electrophoresis element, etc., a display device adopting micro-electromechanical systems (MEMS), and a display device adopting electrochromism.

FIG. 1 is a plan view showing a configuration example of a display device DSP of this embodiment. Here, as an example of the display device DSP, a liquid crystal display device equipped with a sensor SS will be described.

As shown in FIG. 1, the first direction X, the second direction Y and the third direction Z are orthogonal to each other, but the first direction X and the second direction Y may intersect at an angle other than 90 degrees. The first direction X and the second direction Y correspond to the directions parallel to the surface of a substrate which constitutes the display device DSP. For example, the first direction X is parallel to short edges of the display device DSP, and the second direction Y is parallel to long edges of the display device DSP. The third direction Z corresponds to a thickness direction of the display device DSP.

In the following explanation, the third direction Z is referred to as upward (or merely above), and an opposite direction to the third direction Z is referred to as downward (or merely below). Further, such expressions as "the second member above the first member" and "the second member below the first member", the second member may be in contact with the first member or may be separated from the first member. In the case of the latter, the third member may be interposed between the first member and the second member. On the other hand, such expression as "the second member on the first member" and "the second member under the first component", the second member is in contact with the first member. Viewing an X-Y plane defined by the first direction X and the second direction Y from the opposite direction to the third direction Z is referred to as plan view. Viewing the display device DSP cut along an X-Z plane defined by the first direction X and the third direction Z or along a Y-Z plane defined by the second direction Y and the third direction Z is referred to as sectional view.

FIG. 1 is a plan view partially showing the display device DSP in the X-Y plane defined by the first direction X and the second direction Y. The display device DSP comprises a display panel PNL, an IC chip I1, a wiring substrate SUB3, etc.

The display panel PNL is a liquid crystal display panel, and includes a first substrate SUB1, a second substrate SUB2, a sealant SE, and a display function layer (liquid crystal layer LC which will be described later). The first substrate SUB1 and the second substrate SUB2 oppose each other along the third direction Z. In the example illustrated, the second substrate SUB2 is provided above the first substrate SUB1. The sealant SE is provided in a region indicated by hatching of slashing lines in FIG. 1, and the first substrate SUB1 and the second substrate SUB2 are adhered to each other by the sealant SE. The display function layer is held between the first substrate SUB1 and the second substrate SUB2.

The display panel PNL includes a display area DA and a non-display area (peripheral area) NDA. The display area DA is a region which displays images and is located on an inner section surrounded by the sealant SE. The non-display area NDA surrounds the display area DA. The sealant SE is located on the non-display area NDA.

The wiring substrate SUB3 is mounted on the first substrate SUB1. The wiring substrate SUB3 is, for example, a flexible substrate with flexibility. A flexible substrate applicable to the present embodiment should only be of a type which at least partially includes a flexible portion formed of a flexible material. For example, the wiring substrate SUB3 of the present embodiment may be a flexible substrate which is entirely formed as a flexible portion, or may also be a rigid flexible substrate which includes a rigid portion formed of a hard material such as glass epoxy and a flexible portion formed of a flexible material such as polyimide.

The IC chip I1 is mounted on the wiring substrate SUB3. Note that the IC chip I1 is not limited to the example shown in the drawing and may be mounted on the first substrate SUB1 which extends out from the second substrate SUB2 or may be mounted on an external circuit board connected to the wiring substrate SUB3. The IC chip I1 contains, for example, a display driver DD built therein, which outputs a signal necessary to display an image. The display driver DD described here includes at least a part of a signal line driver SD, a scanning line driver GD, and a common electrode driver CD, which will be described later. In the example illustrated, the IC chip I1 contains a detection circuit RC built therein, which functions as a touch panel controller or the like. The detection circuit RC may be incorporated in some other IC chip than the IC chip I1.

The display panel PNL may be, for example, a transmissive display panel which has a transmissive display function of displaying an image by selectively transmitting light from below the first substrate SUB1 (an opposite side to the display surface), a reflective display panel which has a reflective display function of displaying an image by selectively reflecting light from above the second substrate SUB2 (a display surface side), or a transreflective display panel which has the transmissive display function as well as the reflective display function.

The sensor SS installed on the display device DSP senses an object touching on or approaching to the display device DSP. The sensor SE comprises a plurality of detection electrodes Rx (Rx1, Rx2, . . . ). The detection electrodes Rx are provided on the second substrate SUB2. The detection electrodes Rx each extend along the first direction X, and are arranged to be spaced from each other along the second direction Y. While FIG. 1 illustrates detection electrodes Rx1 to Rx4 as the detection electrodes Rx, the detection electrode Rx1 is focused on to describe an example of the configuration thereof.

That is, the detection electrode Rx1 comprises detectors RS, a terminal RT1 and a connector CN.

The detector RS is located in the display area DA and extends along the first direction X. In the detection electrode Rx1, the detector RS is mainly used for sensing. In the example illustrated, although the detector RS is formed in a strip shape, more specifically, the detector RS is formed of an aggregate of fine metal wires as will be explained later with reference to FIG. 5. One detection electrode Rx1 comprises two detectors RS but may comprise three or more detectors RS or one detector RS.

The terminal RT1 is located on one end side of the non-display area NDA along the first direction X and is connected to the detectors RS. The connector CN is located on the other end side of the non-display area NDA along the first direction X and connects the detectors RS to each other. In FIG. 1, one end side corresponds to the left side with respect to the display area DA, and the other side corresponds to the right side with respect to the display area DA. A part of the terminal RT1 is formed in a position which overlaps the sealant SE in plan view.

On the other hand, the first substrate SUB1 includes a pad P1 and a wiring line W1. The pad P1 and the wiring line W1 are located on the one end side of the non-display area NDA, and overlap the sealant SE in plan view. The pad P1 is formed in a position which overlaps the terminal RT1 in plan view. The wiring line W1 is connected to the pad P1 and extends along the second direction Y to be electrically connected to the detection circuit RC of the IC chip I1 via the wiring substrate SUB3.

In this embodiment, the pad P1 and the wiring line W1 may be referred to as a first conductive layer L1, and the detection electrode Rx1 may be referred to as a second conductive layer L2. The display panel PNL comprises a contact hole V1 for connecting the first conductive layer L1 and the second conductive layer L2 to each other in the non-display area NDA. The contact hole V1 is formed in a position where the terminal RT1 and the pad P1 are opposed to each other. Further, the contact hole V1 may penetrate the second substrate SUB2 including the terminal RT1 and the sealant SE and may also penetrate the pad P1. In the example illustrated, the contact hole V1 is circular in plan view, but the shape thereof is not limited to that of the example illustrated, but may be some other shape such as elliptical. A connecting material is provided in the contact hole V1 to electrically connect the terminal RT1 and the pad P1 to each other. Thereby, the detection electrode Rx1 provided in the second substrate SUB2 is electrically connected to the detector RC via the wiring substrate SUB3 connected to the first substrate SUB1. The detector RC reads the sensor signal output from the detection electrode Rx, and detects whether an object touching or approaching or not, the position coordinate of an object, etc.

In the example illustrated, the odd-numbered terminals RT1, RT3, . . . of respective odd-numbered detection electrodes Rx1, Rx3, . . . , the pads P1, P3, . . . , the wiring lines W1, W3, . . . , and the contact holes V1, V3, . . . , are all located in the one end side of the non-display area NDA. On the other hand, the even-numbered terminals RT2, RT4, . . . of respective even-numbered detection electrodes Rx2, Rx4, . . . , the pads P2, P4, . . . , the wiring lines W2, W4, . . . , and the contact holes V2, V4, . . . , are all located in the other end side of the non-display area NDA. With such a layout, the width of one end side of the non-display area NDA and the width of the other end side can be equalized, thereby making it easier to reduce the width of the frame.

As illustrated in the drawing, in the layout in which the pad P3 is closer to the wiring substrate SUB3 than the pad P1, the wiring line W1 detours around an inner side of the pad P3 (i.e., the side close to the display area DA) and is arranged on an inner side of the wiring line W3 between the pad P3 and the wiring substrate SUB3. Similarly, the wiring line W2 detours around an inner side of the pad P4 and is arranged on an inner side of the wiring line W4 between the pad P4 and the wiring substrate SUB3.

FIG. 2 is a diagram showing a basic structure and an equivalent circuit of the display panel PNL shown in FIG. 1.

The display panel PNL comprises a plurality of pixels PX in the display area DA. Here, each pixel PX indicates a minimum unit individually controllable according to a pixel signal, and exists in the region containing a switching element provided at a position where a scanning line and a signal line cross each other, for example, which will be described later. The pixels PX are arranged in a matrix along the first direction X and the second direction Y. Further, the display panel PNL comprises a plurality of scanning lines G (G1 to Gn), a plurality of signal lines S (S1 to Sm), common electrode CE, etc., in the display area DA. The scanning lines G each extend along the first direction X and are arranged along the second direction Y. The signal lines S each extend along the second direction Y and are arranged along the first direction X. The scanning lines G and the signal lines S are not necessarily formed to extend linearly, but may be partially bent. The common electrode CE is provided for a plurality of pixels PX. The scanning lines G, the signal lines S and the common electrode CE are all drawn out to the non-display area NDA. In the non-display area NDA, the scanning lines G are connected to the scanning line driver GD, the signal lines S are connected to the signal line driver SD, and the common electrode CE is connected to the common electrode driver CD. The signal line driver SD, the scanning line driver GD and the common electrode driver CD may be formed on the first substrate SUB1 or partially or entirely built in the IC chip I1 shown in FIG. 1.

Each pixel PX comprises a switching element SW, a pixel electrode PE, a common electrode CE, a liquid crystal layer LC, etc. The switching element SW is, for example, a thin film transistor (TFT) and is electrically connected to a respective scanning line G and a respective signal line S. More specifically, the switching element SW comprises a gate electrode WG, a source electrode WS and a drain electrode WD. The gate electrode WG is electrically connected to the scanning line G. In the example illustrated, the electrode electrically connected to the signal line S is referred to as the source electrode WS, and the electrode electrically connected to the pixel electrode PE is referred to as the drain electrode WD.

The scanning line G is connected to the switching element SW in each of those pixels PX which are arranged along the first direction X. The signal line S is connected to the switching element SW in each of those pixels PX arranged along the second direction Y. Each of the pixel electrodes PE opposes the common electrode CE and drives the liquid crystal layer LC with an electric field produced between the pixel electrode PE and the common electrode CE. A storage capacitor CS is formed, for example, between the common electrode CE and the pixel electrode PE.

FIG. 3 is a cross section showing a part of structures of the display area DA of the display panel PNL shown in FIG. 1. Here, a cross section of the display device DSP cut along the X-Z plane defined by the first direction X and the third direction Z is shown. The third direction Z is the direction from the first substrate SUB1 towards the second substrate SUB2.

The display panel PNL illustrated here has a structure provided for the display mode which mainly uses a lateral electric field substantially parallel to a surface of the substrate. The display panel PNL may have a structure provided for display mode using a vertical electric field perpendicular to the surface of the substrate, or an electric field oblique to the surface, or a combination thereof. To the display mode using a lateral electric field, for example, such a structure is applicable, that both of the pixel electrode PE and the common electrode CE are provided one of the first substrate SUB1 and the second substrate SUB2. To the display mode using a vertical electric field or an oblique electric field, for example, such a structure is applicable, that one of the pixel electrode PE and the common electrode CE is provided on the first substrate SUB1, and the other one of the pixel electrode PE and the common electrode CE is provided on the second substrate SUB2. Note that the surface of the substrate here is that parallel to the X-Y plane.

The first substrate SUB1 is formed using a first basement 10. The first basement 10 is formed, for example, from an insulating material such as glass or resin. The first basement 10 comprises a surface 10A opposing the second substrate SUB2 and a surface 10B on an opposite side to the surface 10A. The first substrate SUB1 comprises, on a surface 10A side of the first basement 10, signal lines S, a common electrode CE, metal layers M, pixel electrodes PE, an insulating layer 11, another insulating layer 12, still another insulating layer 13, a first alignment film AL1, etc. Note that the switching element, scanning lines, various insulating layers located between these, etc., are omitted from the illustration.

The insulating layer 11 is located on the first basement 10. The scanning lines and the semiconductor layers of the switching elements not shown in the drawing are located between the first basement 10 and the first insulating layer 11. The signal lines S are located on the insulating layer 11. The second insulating layer 12 is located on the signal lines S and the insulating layer 11. The common electrode CE is located on the insulating layer 12. The metal layers M are in contact with the common electrode CE at positions directly above the signal lines S, respectively. In the example illustrated, the metal layers M are located on the common electrode CE, but may be located between the common electrode CE and the insulating layer 12. The insulating layer 13 is located on the common electrode CE and the metal layers M. The pixel electrodes PE are located on the insulating layer 13. The pixel electrodes PE oppose the common electrode CE via the insulating layer 13. The pixel electrodes PE each comprise a slit SL in a position opposing the common electrode CE. The first alignment film AL1 covers the pixel electrode PE and the insulating layer 13.

The scanning lines, the signal lines S and the metal layer M are formed of metal materials such as molybdenum, tungsten, titanium and aluminum and may be formed in a single- or multi-layer structure. The common electrode CE and the pixel electrode PE are each formed from a transparent conductive material such as indium tin oxide (ITO) or indium zinc oxide (IZO). The insulating layer 11 and the insulating layer 13 are inorganic insulating layers, and the insulating layer 12 is an organic insulating layer. In this embodiment, the scanning lines are formed of a metal material containing tungsten, and the signal lines S are formed of a metal material containing aluminum.

Note that the structure of the first substrate SUB1 is not limited to the example illustrated, but the pixel electrodes PE may be located between the insulating layer 12 and the insulating layer 13 and the common electrode CE may be located between the insulating layer 13 and the first alignment film AL1. In such a case, the pixel electrodes PE are each formed into a plate shape without a slit, and the common electrode CE is formed to comprise a slit which opposes the pixel electrode PE. Or, the pixel electrodes PE and the common electrode CE may be each formed into a comb teeth shape and arranged to engage with each other in gear.

The second substrate SUB2 is formed using a second basement 20. The second basement 20 is formed of, for example, an insulating material such as glass or resin. The second basement 20 comprises a surface 20A opposing the first substrate SUB1 and a surface 20B on an opposite side to the surface 20A. The second substrate SUB2 comprises, on a surface 20A side of the second basement 20, light-shielding layers BM, color filters CF, an overcoat layer OC, a second alignment film AL2, etc.

The light-shielding layers BM and the color filters CF are located on the surface 20A side of the second basement 20. The light-shielding layers BM partition the pixels from each other and are located directly above the signal lines S, respectively. The color filters CF oppose the pixel electrodes PE and partially overlap the light-shielding layers BM. The color filters CF include a red color filter, a green color filter, a blue color filter and the like. The overcoat layer OC covers the color filters CF. The second alignment film AL2 covers the overcoat layer OC.

The color filters CF may be disposed on the first substrate SUB1. The color filters CF may include color filters of four or more colors. On a pixel to display a white color, a white color filter or an uncolored resin material may be disposed or the overcoat layer OC may be disposed without disposing the color filter.

A detection electrode Rx is located on the surface 20B of the second basement 20. The detection electrode Rx corresponds to the second conductive layer L2, may be formed from a conductive layer containing a metal or a transparent conductive material such as ITO or IZO, or formed by depositing a transparent conductive layer on a conductive layer containing a metal, or formed of a conductive organic material or a dispersing element of fine conductive materials or the like.

A first optical element OD1 including a first polarizer PL1 is located between the first basement 10 and an illumination device BL. A second optical element OD2 including a second polarizer PL2 is located on the detection electrode Rx. Each of the first optical element OD1 and the second optical element OD2 may include a retardation film as needed.

Figure 4:
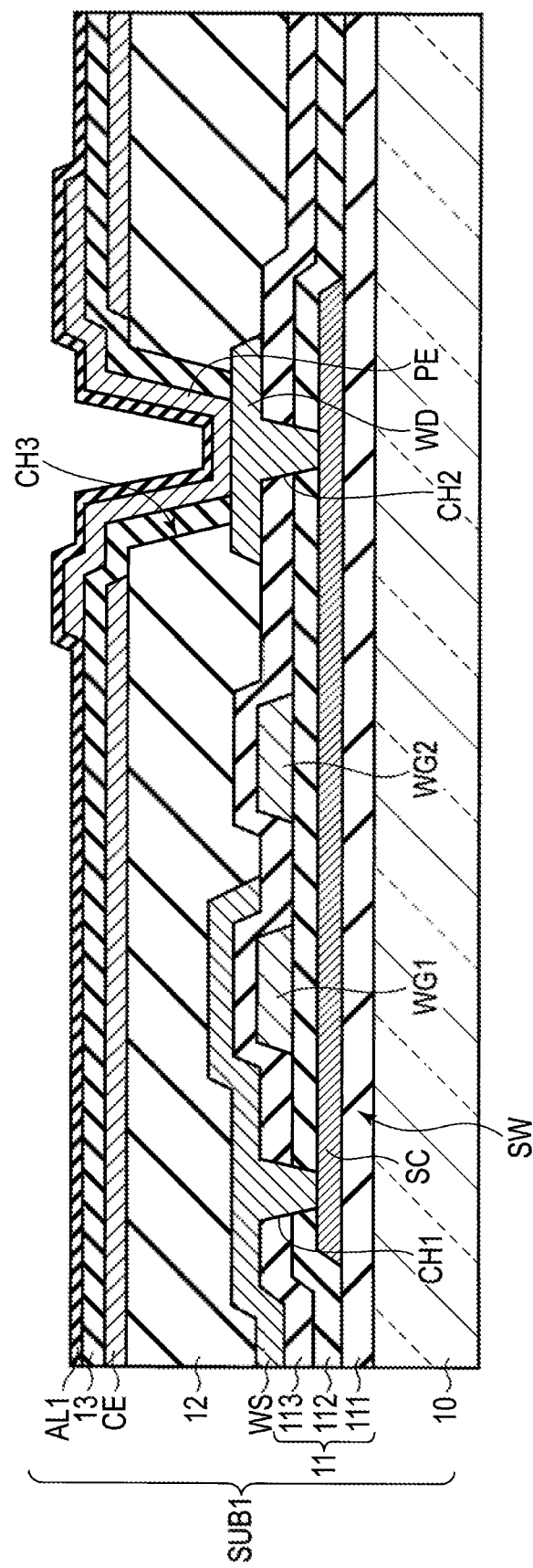
FIG. 4 is a cross section illustrating how a switching element SW and a pixel electrode PE are connected to each other.

FIG. 4 is a cross section illustrating how the switching element SW and the pixel electrode PE in the first substrate SUB1 are connected. Here, a double-gate type thin film transistor is shown as the switching element SW, but the switching element SW may be a single-gate type thin film transistor.

The semiconductor layer SC which constitutes the switching element SW is formed on the first insulating layer 111 as an undercoat layer, and is covered by the second insulating layer 112. Gate electrodes WG11 and WG12 are formed on the second insulating layer 112 and are covered by the third insulating layer 113. The source electrode WS and the drain electrode WD are formed on the third insulating layer 113. The source electrode WS and the drain electrode WD are connected to the semiconductor layer SC via a contact hole CH1 and a contact hole CH2 formed in the first insulating layer 111 and the second insulating layer 112, respectively. The insulating layer 111, the insulating layer 112 and the insulating layer 113 correspond to the insulating layer 11 shown in FIG. 3.

The insulating layer 12 covers the source electrode WS and the drain electrode WD and is formed also on the third insulating layer 113. In the illustrated example, a contact hole CH3 penetrating through to the drain electrode WD is formed in the region of the insulating layer 12, which overlaps the contact hole CH2. The common electrode CE is formed on the insulating layer 12 except the region in which the contact hole CH3 is provided. The insulating layer 13 covers the common electrode CE and is formed also on the insulating layer 12. In the illustrated example, the insulating layer 13 also covers the side surface of the contact hole CH3 and comprises a hole which at least partially exposes the drain electrode WD. The pixel electrode PE is in contact with the drain electrode WD via the contact hole CH3.

Next, a configuration example of the sensor SS built in the display device DSP of this embodiment will be explained. The sensor SS explained below is, for example, a capacitive sensor of a mutual-capacitive type, which detects contact or approach of an object, based on the variation in electrostatic capacitance between a pair of electrodes opposing via a dielectric.

FIG. 5 is a plan view showing a configuration example of the sensor SS.

In the configuration example illustrated, the sensor SS comprises sensor drive electrodes Tx and detection electrodes Rx. In the example illustrated, the sensor drive electrodes Tx correspond to portions hatched by lines downwardly slanting to the right and are provided on the first substrate SUB1. The detection electrodes Rx correspond to portions hatched by lines upwardly slanting to the right and are provided on the second substrate SUB2. The drive electrodes Tx and the detection electrodes Rx cross each other in the X-Y plane. The detection electrodes Rx oppose the sensor drive electrodes Tx along the third direction Z.

The sensor drive electrodes Tx and the detection electrodes Rx are located in the display area DA and some of the electrodes extend out to the non-display area NDA. In the example illustrated, the sensor drive electrodes Tx are each formed in a strip shape extending along the second direction Y and arranged along the first direction X to be spaced from each other. The detection electrodes Rx each extend along the first direction X and are arranged along the second direction Y to be spaced apart from each other. The detection electrodes Rx are connected to the pads provided on the first substrate SUB1 and electrically connected to the detection circuit RC via the wiring lines as explained with reference to FIG. 1. Each of the sensor drive electrodes Tx is electrically connected to the common electrode driver CD via a wiring line WR. The number, size and shape of the sensor drive electrodes Tx and the detection electrodes Rx are not particularly limited but can be variously changed.

The sensor drive electrodes Tx include the above-described common electrode CE, and have a function of generating an electric field between itself and the respective pixel electrode PE and also a function of detecting the position of the object by generating the capacitance between itself and the respective detection electrode Rx.

The common electrode driver CD supplies common drive signals to the sensor drive electrodes Tx including the common electrode CE at the display driving time to display images on the display area DA. Further, the common electrode driver CD supplies sensor drive signals to the sensor drive electrodes Tx at the sensing driving time to execute sensing. The detection electrodes Rx output sensor signals necessary for sensing (i.e., signals based on variation in inter-electrode capacitance between the sensor drive electrodes Tx and the detection electrodes Rx) in accordance with supply of the sensor drive signals to the sensor drive electrodes Tx. The detection signals output from the detection electrodes Rx are input to the detection circuit RC shown in FIG. 1.

The sensor SS in each of the above-explained configuration examples is not limited to the sensor of the mutual-capacitive type which detects the object based on the variation in electrostatic capacitance between a pair of electrodes (in the above case, the electrostatic capacitance between the sensor drive electrodes Tx and the detection electrodes Rx), but may be a self-capacitive type which detects an object based on the variation in electrostatic capacitance between the detection electrodes Rx.

Figure 6A:
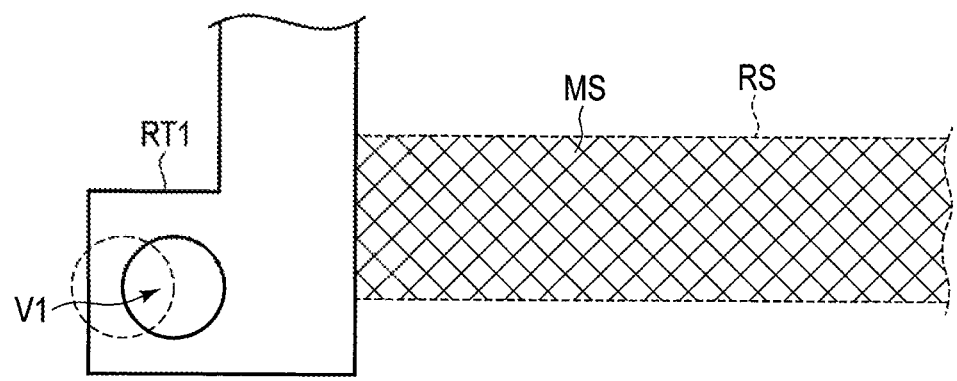
FIG. 6A is an expanded view showing a detection electrode of the display device shown in FIG. 1.
Figure 6B:
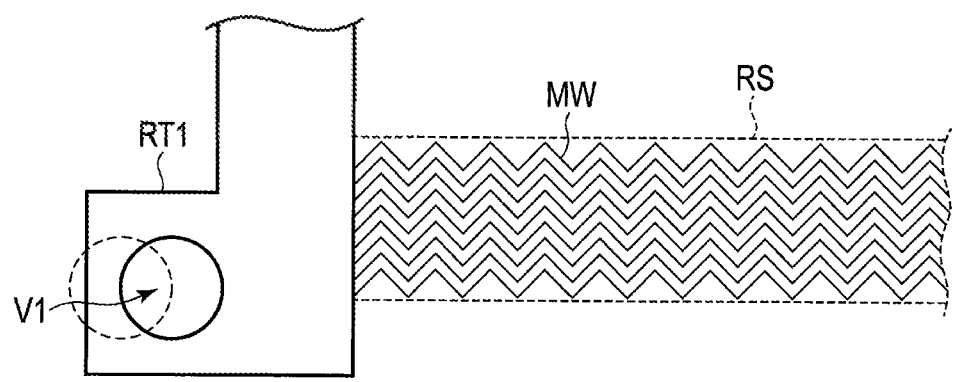
FIG. 6B is an expanded view showing another example of the detection electrode of the display device shown in FIG. 1.

FIGS. 6A and 6B are diagrams each showing a configuration example of a detector RS in the detection electrode Rx1 shown in FIG. 1.

In the example shown in FIG. 6A, the detector RS is formed of mesh-shaped metal wires MS. The metal wires MS are joined to the terminal RT1. In the example shown in FIG. 6B, the detector RS is formed of wave-shaped metal wires MW. In the example illustrated, the metal wires MW are formed in a sawtooth shape but may be in some other shape such as a sine wave shape. The metal wires MW are joined to the terminal RT1.

The terminal RT1 is formed of, for example, the same material as that of the detector RS. A circular contact hole V1 is formed in the terminal RT1. Note that the contact hole V1 may partially overlap the terminal RT1 as indicated by a circle of a dashed line.

Figures 7A, 7B:
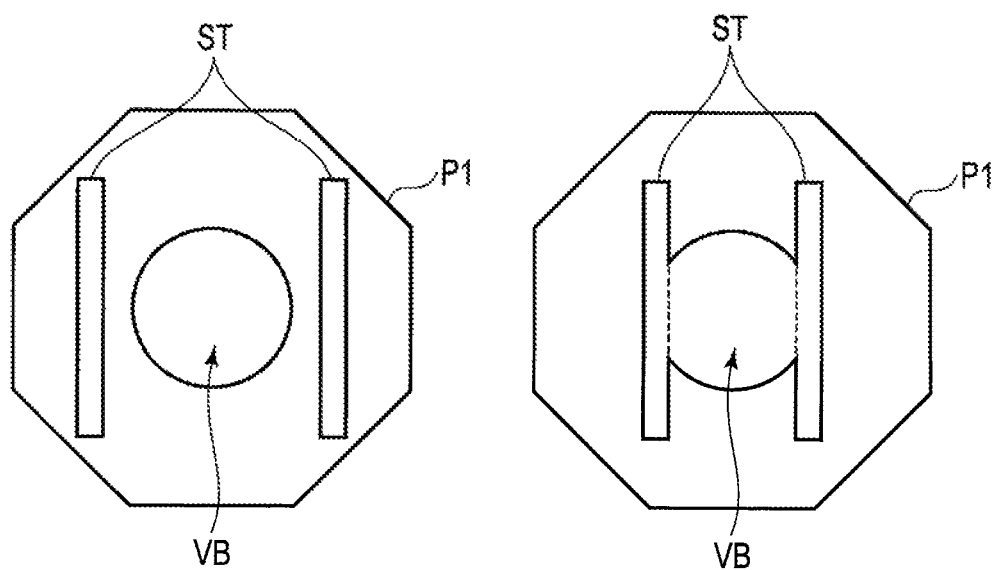
FIG. 7A is an expanded plan view showing a pad shown in FIG. 1.
FIG. 7B is an expanded plan view showing another example of the pad shown in FIG. 1.

FIGS. 7A and 7B are expanded view showing the pad P1 shown in FIG. 1.

In the illustrated example, the pad P1 is octagonal, but may be polygonal other than octagonal, or circular or elliptical, or any shape formed of straight and curved lines.

The pad P1 comprises a hole VB. In the example illustrated, the pad P1 comprises slits ST sandwiching the hole VB therebetween. With this structure, even if, for example, the sealant SE overlaps the pad P1, ultraviolet rays reach the sealant SE through the slits ST to harden the sealant SE by irradiation of ultraviolet rays and therefore the sealant can be reliably hardened. In the example shown in FIG. 7A, the slits ST are spaced from the hole VB. In the example shown in FIG. 7B, the slits ST are communicated to the hole VB. Note that the number of slits ST may be one or three or more, or may be omitted.

FIG. 8 is a cross section of the display panel PNL shown in FIG. 1 taken along line A-B, which includes a contact hole V1. Here, only the main parts necessary for the description is illustrated.

The first substrate SUB1 comprises, on a surface 10A side of the first basement 10, the pad P1 corresponding to the first conductive layer L1, the insulating layer 11, the insulating layer 12, the insulating layer 13, the first alignment film AL1, etc.

The insulating layer 11 has a multi-layer structure in which the first insulating layer 111, the second insulating layer 112 and the third insulating layer 113 are stacked in this order, and is formed on the surface 10A of the first basement 10, as described above. The first insulating layer 111 is formed under the semiconductor layer SC of the switching element SW in the display area DA. The second insulating layer 112 covers the semiconductor layer SC of the switching element SW in the display area DA. The third insulating layer 113 covers the gate electrode WG of the switching element SW and the scanning line G connected the gate electrode WG in the display area DA.

The pad P1 is formed on the surface 10A of the first basement 10. That is, the insulating layer 11 comprises a concavity (groove) GR. In the illustrated example, the concavity GR penetrates the first insulating layer 111, the second insulating layer 112, the third insulating layer 113 and even to the first basement 10. The pad P1 is in contact with the surface 10A in the concavity GR. In the illustrated example, the pad P1 is formed on the surface 10A of the first basement 10 in the concavity GR, and also on side surfaces of the first insulating layer 111, side surfaces of the second insulating layer 112, side surfaces of the third insulating layer 113 and also an upper surface of the third insulating layer 113.

The pad P1 is formed from the same material as that of the signal lines S shown in FIG. 3. More specifically, the pad P1 has a multi-layer structure in which titanium (Ti), aluminum (Al) and titanium (Ti) are stacked in this order. Note that the pad P1 can also be formed from the same material as that of the scanning lines G shown in FIG. 1. But, when the scanning lines G are formed from a material containing tungsten as described above, the pad P1 should preferably be formed of a material different from that of the scanning lines G. Tungsten has a melting point higher than that of aluminum, and therefore when forming the hole VB by irradiating a laser beam, for example, the hole VB may be formed into a shape unsuitable to electrically connect the connecting material C and the pad P1 to each other. Therefore, when the scanning lines G are formed of a material containing tungsten and the signal lines S are formed of a metal material not containing tungsten and mainly containing a metal having a relatively low melting point, such as aluminum, the pad P1 should preferably be formed from the same material as that of the signal lines S.

The insulating layer 12 is formed on the third insulating layer 113 on a display area DA side with respect to the pad P1 so as not to cover the pad P1. The insulating layer 12 covers the source electrode WS and the drain electrode WD of the switching element SW and the signal line S connected to the source electrode WS in the display area DA.

The insulating layer 13 is formed on the insulating layer 12. The insulating layer 13 may cover the pad P1. The insulating layer 13 covers the common electrode CE in the display area DA.

The first alignment film AL1 covers the third insulating layer 113, the pad P1, the insulating layer 12 and the insulating layer 13. In the illustrated example, the first alignment film AL1 is also provided in the slits ST of the pad P1, but may be removed from the slits ST. The first alignment film AL1 need not necessarily cover the pad P1. The first alignment film AL1 covers the pixel electrode PE in the display area DA.

The second substrate SUB2 comprises, on a surface 20A of the second basement 20, the light-shielding layer BM, the overcoat layer OC, the second alignment film AL2, each of which are formed from a respective organic material, etc. The second substrate SUB2 comprises, on a surface 20B of the second basement 20, a detection electrode Rx1 equivalent to the second conductive layer L2. The detection electrode Rx1 is covered by a protection material PF.

The protection material PF is formed, for example, from an organic insulating material such as acrylic resin.

The sealant SE is formed from an organic material and is located between first substrate SUB1 and the second substrate SUB2 at least in the region in which the pad P1 is formed.

The liquid crystal layer LC is located in a gap between the first substrate SUB1 and the second substrate SUB2 in the region in which the insulating layer 12 is formed.

In this embodiment, the light shielding layer BM, the overcoat layer OC, the second alignment film AL2, the sealant SE, the first alignment film AL1 and the insulating layer 12, which are provided between the first basement 10 and the second basement 20 may be referred to as a structure formed from an organic material. Further, of the organic material-made structure, the light shielding layer BM, the overcoat layer OC and the second alignment film AL2 may be referred to as a first organic insulating layer, and the insulating layer 12 may be referred to as a second organic insulating layer. The sealant SE is located between the first organic insulating layer and the first substrate SUB1.

The contact hole V1 includes the hole VA which penetrates the second basement 20, the hole VB which penetrates the pad P1, the hole VC which penetrates the organic material-made structure, and a concavity CC formed in the first basement 10. In the example illustrated, the contact hole V1 penetrates the terminal RT of the detection electrode Rx. The concavity CC, holes VB, VC and VA are arranged in this order along the third direction Z and also located on the same straight line along the third direction Z.

The hole VA has a tapered cross section, for example. The width of the hole VA in the surface 20B of the second basement 20 along the first direction X is greater than the width of the hole VA in the surface 20A along the first direction X.

The hole VC is formed between the surface 20A of the second basement 20 and a surface P1A of the pad P1, which opposes the second substrate SUB2 (, which will be referred to as an upper surface hereafter). The hole VC comprises a first part VC1 which penetrates the first organic insulating layers provided in the second substrate SUB2, that is, the light shielding layer BM, the overcoat layer OC and the second alignment film AL2, and a second part VC2 which penetrates the sealant SE. In the illustrated example, the second partial VC2 penetrates the first alignment film AL1 as well. The second part VC2 and the first part VC1 are arranged along the third direction Z in this order. The first part VC1 communicates to the hole VA, and the second part VC2 communicates to first part VC1 and the hole VB.

A width WC of the hole VC in the upper surface P1A of the pad P1 along the first direction X is greater than a width WB of the hole VB along the first direction X. In the example illustrated, the hole VC partially exposes the upper surface P1A of the pad P1.

The connecting material C is provided in the contact hole V1 to electrically connect the detection electrode Rx1 corresponding to the second conductive layer L2, and the pad P1 corresponding to the first conductive layer L1 to each other. The connecting material C is formed of a conductive material containing a metal material such as silver. The connecting material C should preferably contain fine particles of a metal material having a diameter of the order of from several nanometers to tens of nanometers. In the example illustrated, the connecting material C has a hollow, which is filled with an insulating filling material FI. The filling material FI partially covers the terminal RT1 of the detection electrode Rx1 in the second substrate SUB2. Note that the hollow may be filled with a conductive filling material. Or the connecting material C may fill the contact hole V1.

In the second substrate SUB2, the connecting material C partially overlaps the terminal RT1 and is in contact with the second basement 20 in the hole VA. Further, the connecting material C is in contact with each of the light shielding layer BM, the overcoat layer OC and the second alignment film AL2 in the first part VC1 of the hole VC, and also each of the sealant SE, the first alignment film AL1 and the upper surface P1A of the pad P1 in the second part VC2 of the hole VC. Further, the connecting material C is in contact with a side surface P1S of the pad P1 in the hole VB, and with the first basement 10 in the concavity CC.

It suffices if the connecting material C is in contact with at least one of the upper surface P1A and the side surface P1S of the pad P1 in the contact hole V1. The pad P1 need not necessarily comprise the hole VB. In this case, the connecting material C is in contact with the upper surface P1A of the pad P1.

According to the display device DSP comprising the sensor SS described above, the detection electrodes Rx provided in the second substrate SUB2 are connected to the pad P1 provided in the first substrate SUB1 by the connecting material C provided in the contact hole V1. Therefore, it is no longer necessary to mount a wiring substrate on the second substrate SUB2 in order to connect the detection electrodes Rx and the detection circuit RC. That is, the wiring substrate SUB3 mounted on the first substrate SUB1 forms a transmission line for transmitting signals necessary to display images on the display panel PNL, and also a transmission line for transmitting signals between the detection electrodes Rx and the detector RC. Therefore, as compared to the configuration example which requires individual wiring substrates in addition to the wiring substrate SUB3, the number of wiring substrates can be reduced. Moreover, the space for connecting the wiring substrates to the second substrate SUB2 is not necessary, and therefore the non-display area of the display panel PNL, especially the width of the side edge in which the wiring substrate SUB3 is mounted can be decreased. Thereby, the width of the frame can be reduced.

(First Modification)

Figure 9:
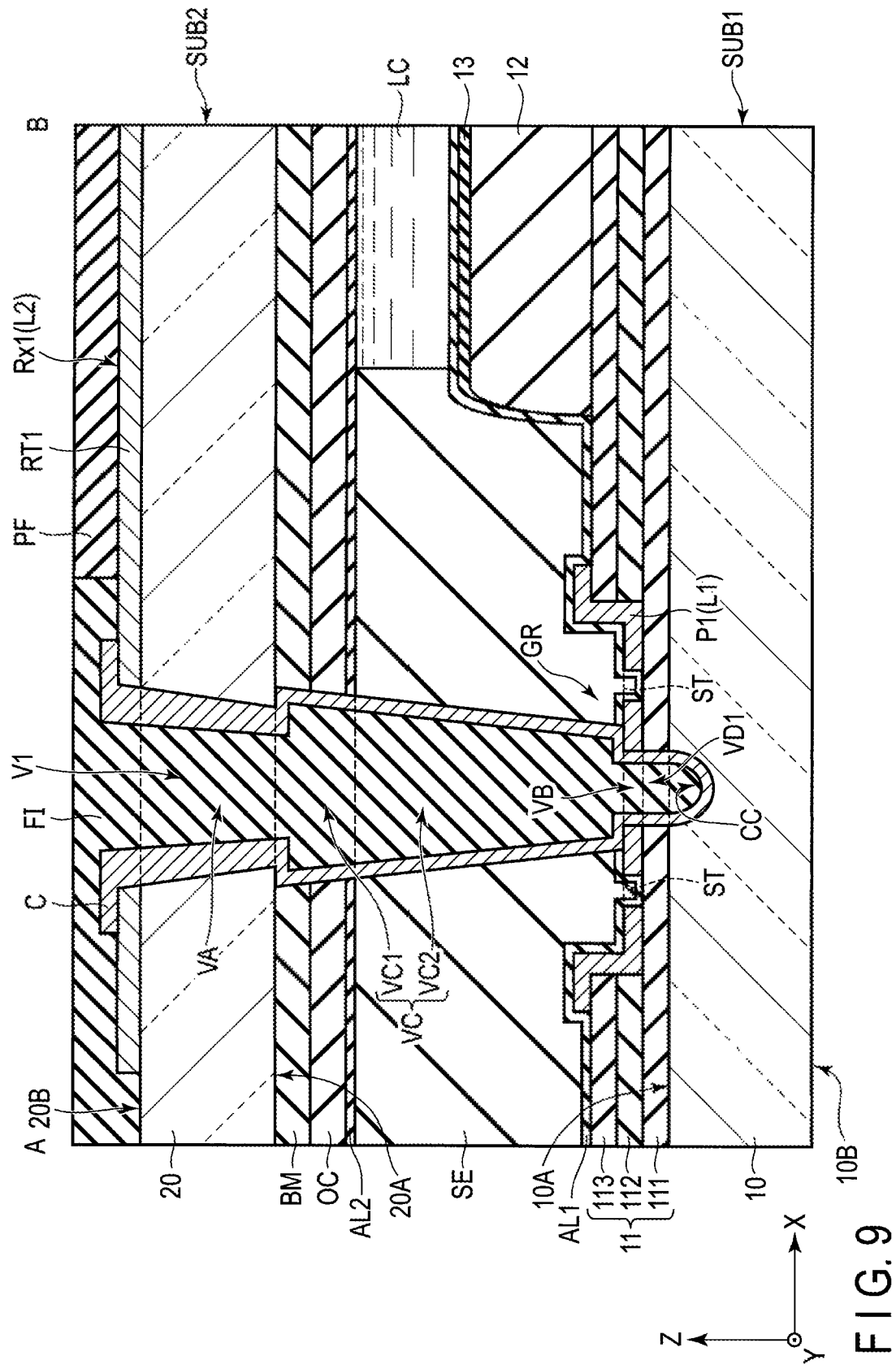
FIG. 9 is a cross section showing a first modification of the display device according to this embodiment.

FIG. 9 shows the first modification of the display device DSP according to this embodiment. In the first modification, the pad P1 corresponding to the first conductive layer L1 is formed on the first insulating layer 111. That is, a concavity GR penetrates the third insulating layer 113 and the second insulating layer 112 to the first insulating layer 111. The pad P1 is in contact with the first insulating layer 111 in the concavity GR. The concavity GR with such configuration can be formed at the same time as that of the contact hole CH1 and the like, described with reference to FIG. 4, for example.

The contact hole V1 includes a hole VD1 penetrating the first insulating layer 111 to communicate to the hole VB and a concavity CC. In the example illustrated, the connecting material C is in contact with the concavity CC via the hole VD1.

(Second Modification)

Figure 10:
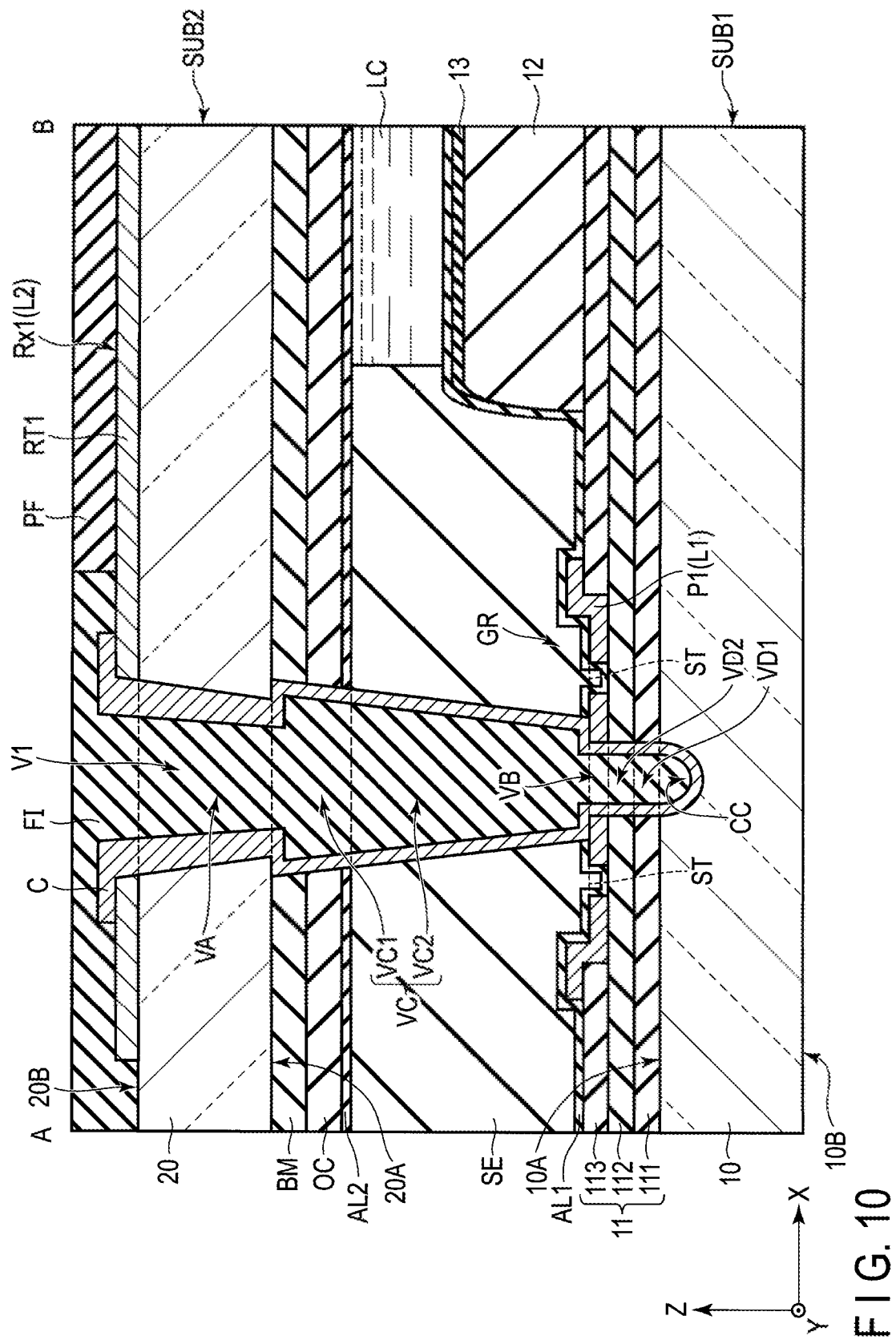
FIG. 10 is a cross section showing a second modification of the display device according to this embodiment.

FIG. 10 shows the second modification of the display device DSP according to this embodiment. In the second modification, the pad P1 corresponding to the first conductive layer L1 is formed on the second insulating layer 112. That is, the concavity GR penetrates the third insulating layer 113 to the second insulating layer 112. The pad P1 is in contact with the second insulating layer 112 in the concavity GR.

The contact hole V1 includes a hole VD2 penetrating the second insulating layer 112 to communicate to the hole VP and a hole VD1 penetrating the first insulating layer 111 to communicate to the hole VD2 and the concavity CC. In the example illustrated, the connecting material C is in contact with the concavity CC via the holes VD2 and VD1.

(Third Modification)

Figure 11:
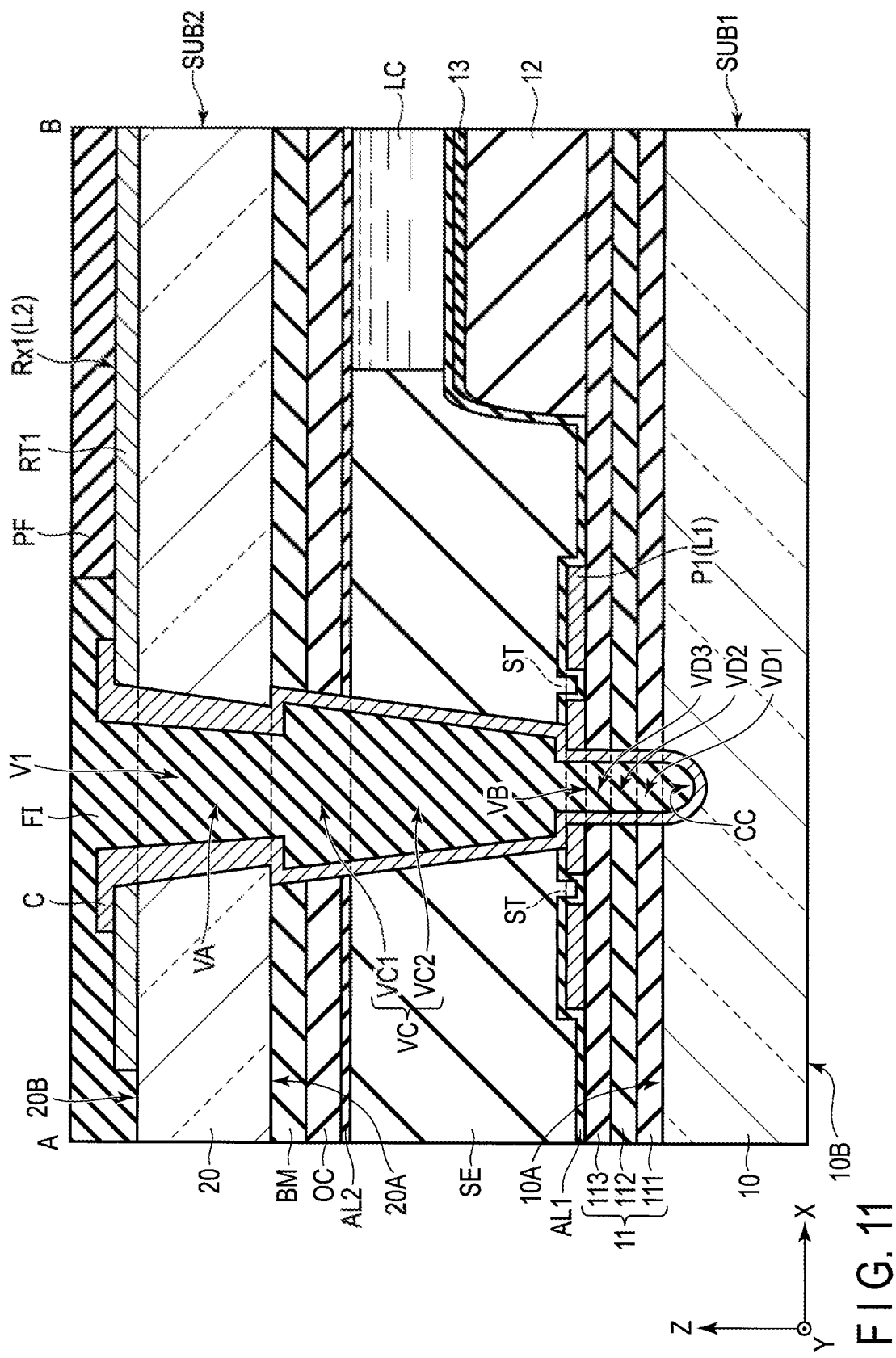
FIG. 11 is a cross section showing a third modification of the display device according to this embodiment.

FIG. 11 shows the third modification of the display device DSP according to this embodiment. In the third modification, the pad P1 corresponding to the first conductive layer L1 is formed on the third insulating layer 113 so as to be in contact with the third insulating layer 113. That is, no concavity GR is formed in the insulating layer 11.

The contact hole V1 includes a hole VD3 penetrating the third insulating layer 113 to communicate to the hole VB, a hole VD2 penetrating the second insulating layer 112 to communicate to the hole VD3, and a hole VD1 penetrating the first insulating layer 111 to communicate to the hole VD2 and the concavity CC. In the example illustrated, the connecting material C is in contact with the concavity CC via the holes VD3, VD2 and VD1.

(Fourth Modification)

Figure 12:
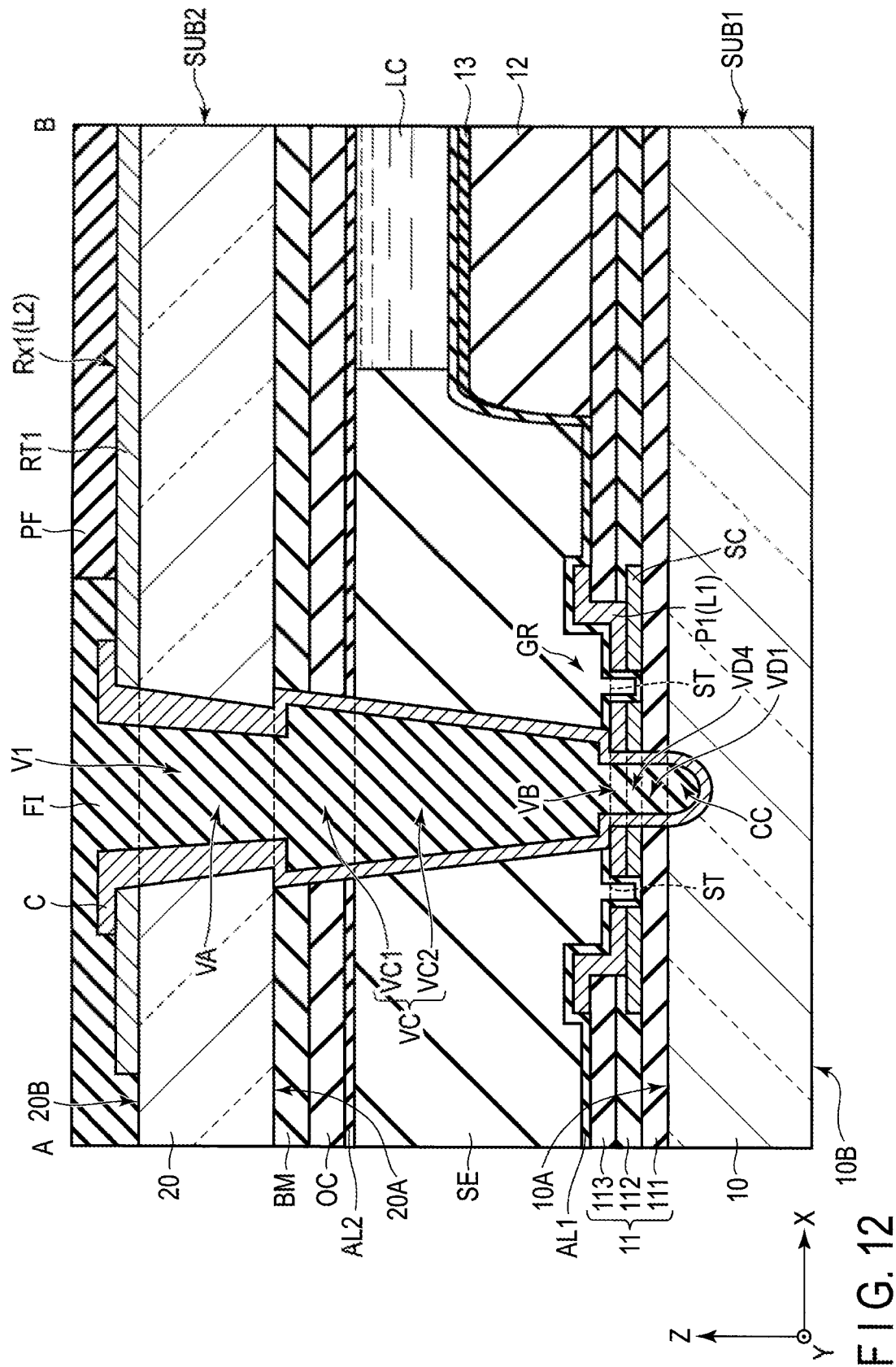
FIG. 12 is a cross section showing a fourth modification of the display device according to this embodiment.

FIG. 12 shows the fourth modification of the display device DSP according to this embodiment. In the fourth modification, the pad P1 corresponding to the first conductive layer L1 is formed on semiconductor layer SC. The semiconductor layer SC is formed on the first insulating layer 111. The semiconductor layer SC of such configuration can be formed at the same time as that of the semiconductor layer of the switching element SW in the display area DA. The concavity GR penetrates the third insulating layer 113 and the second insulating layer 112 to the semiconductor layer SC. The pad P1 is in contact with the semiconductor layer SC in the concavity GR.

The contact hole V1 includes a hole VD4 penetrating semiconductor layer SC to communicate to the hole VB and a hole VD1 penetrating the first insulating layer 111 to communicate to the hole VD4 and the concavity CC. The connecting material C is in contact with semiconductor layer SC in the hole VD4. In the example illustrated, the connecting material C is in contact with the concavity CC via the holes VD4 and VD1.

The pad P1 is in contact with the semiconductor layer SC and both of these are electrically connected to each other, and the semiconductor layer SC and the connecting material C are brought into contact with each other in the hole VD4. With this structure, the contact area between the pad P1 and the connecting material C can be substantially expanded.

(Fifth Modification)

Figure 13:
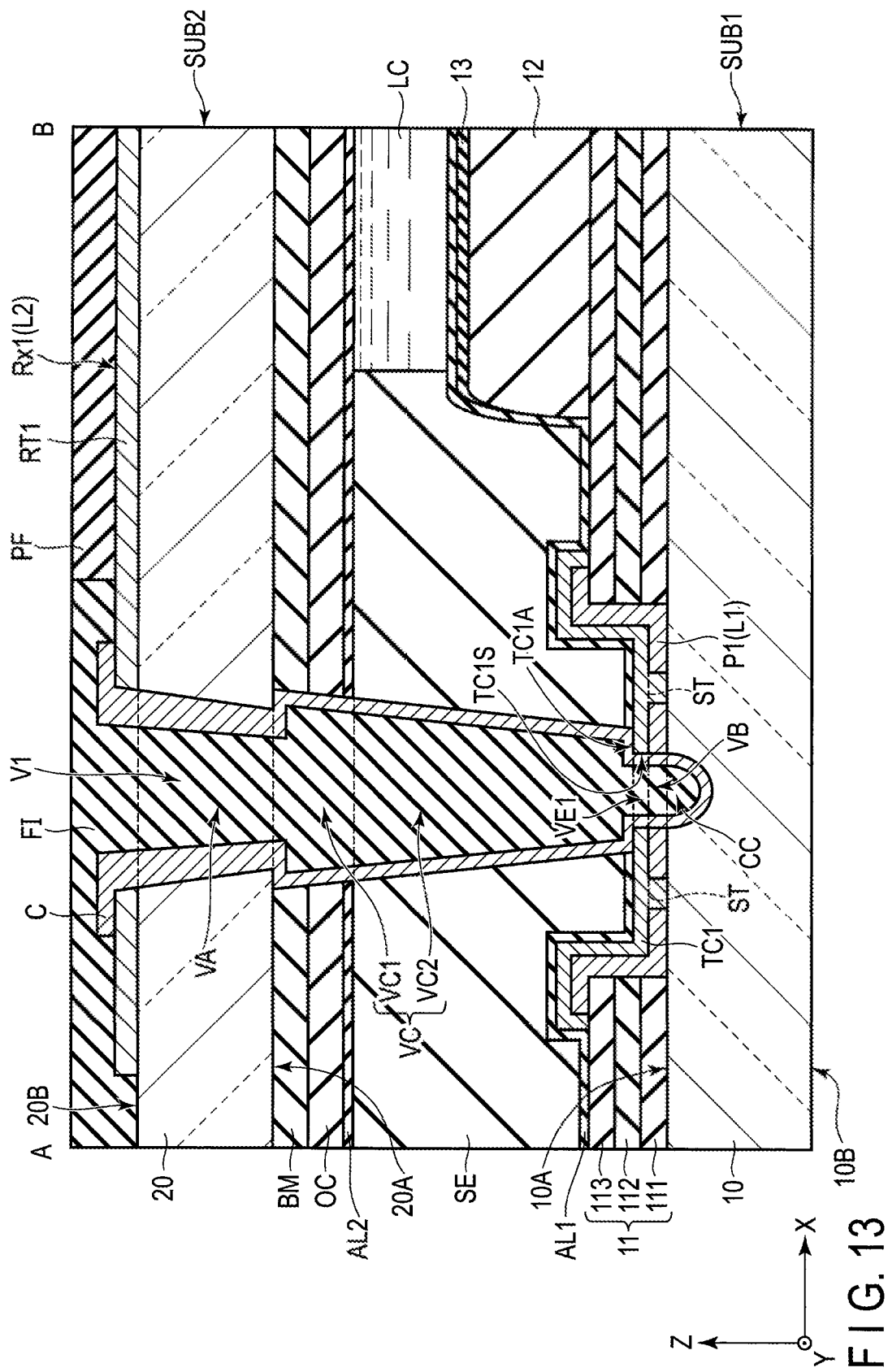
FIG. 13 is a cross section showing a fifth modification of the display device according to this embodiment.

FIG. 13 shows the fifth modification of the display device DSP according to this embodiment. In the fifth modification, the pad P1 corresponding to the first conductive layer L1 is covered by the first transparent conductive layer TC1. The first transparent conductive layer TC1 is formed from a transparent conductive material such as indium tin oxide (ITO) or indium zinc oxide (IZO). The first transparent conductive layer TC1 of such configuration can be formed at the same time as that of the common electrode CE or the pixel electrodes PE in the display area DA. In the example illustrated, the first transparent conductive layer TC1 is formed also in the slits ST of the pad P1, but may be removed from the slits ST.

The contact hole V1 includes a hole VE1 penetrating the first transparent conductive layer TC1 to communicate to the holes VC and VB. In the example illustrated, the connecting material C is in contact with a surface TC1A of the first transparent conductive layer TC1, which opposes the second substrate SUB2 (, which will be referred to as an upper surface hereafter) in the hole VC. Further, the connecting material C is in contact with a side surface TC1S of the first transparent conductive layer TC1 in the hole VE1. The connecting material C is in contact with the concavity CC via the hole VB.

According to the fifth modification, the pad P1 is covered by a conductive material formed of an oxide, and therefore oxidization of the pad P1 can be suppressed. Thereby, it is possible to inhibit the decrease in the conductivity between the first conductive layer L1 and the second conductive layer L2. Further, the pad P1 is in contact with the first transparent conductive layer TC1 and both of these are electrically connected to each other, and the connecting material C is brought into contact with the first transparent conductive layer TC1 in the hole VE1. With this structure, the contact area between the pad P1 and the connecting material C can be substantially expanded. As a result, stable electrical characteristics can be obtained.

(Sixth Modification)

Figure 14:
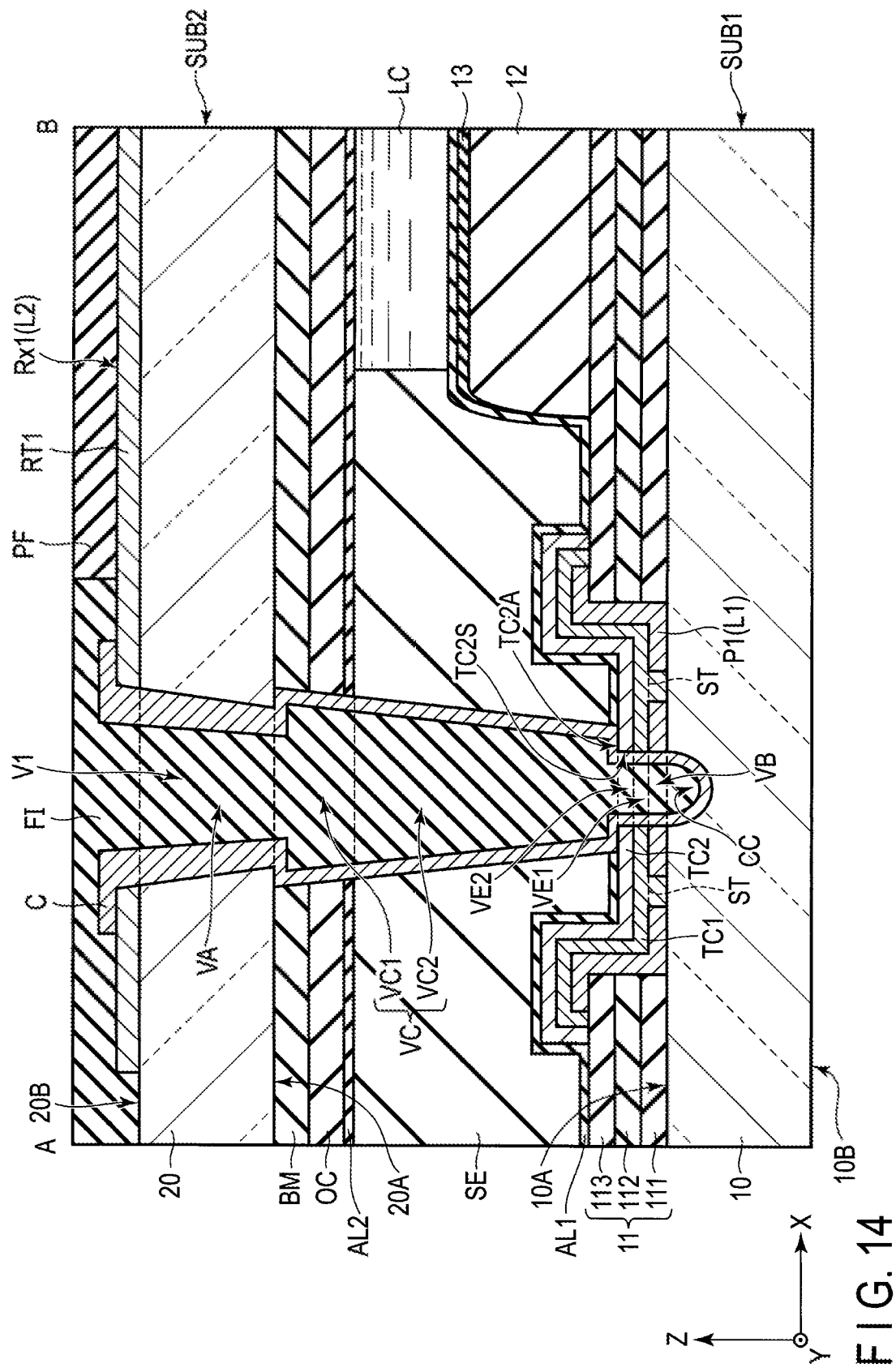
FIG. 14 is a cross section showing a sixth modification of the display device according to this embodiment.

FIG. 14 shows the sixth modification of the display device DSP according to this embodiment. In the sixth modification, the pad P1 corresponding to the first conductive layer L1 is covered by the first transparent conductive layer TC1 and the first transparent conductive layer TC1 is covered by the second transparent conductive layer TC2. The second transparent conductive layer TC2 is formed from a transparent conductive materials such as indium tin oxide (ITO) or indium zinc oxide (IZO). The first transparent conductive layer TC1 having such configuration can be formed at the same time as that of the common electrode CE, for example, and the second transparent conductive layer TC2 can be formed at the same time as that of the pixel electrode PE.

The contact hole V1 includes a hole VE2 penetrating the second transparent conductive layer TC2 to communicate to the hole VC and a hole VE1 penetrating the first transparent conductive layer TC1 to communicate to the holes VE2 and VB. In the example illustrated, the connecting material C is in contact with a surface TC2A of the second transparent conductive layer TC2, which opposes the second substrate SUB2 (, which will be referred to as an upper surface hereafter) in the hole VC. Further, the connecting material C is in contact with a side surface TC2S of the second transparent conductive layer TC2 in the hole VE2. The connecting material C is in contact with the concavity CC via the holes VE1 and VB.

In the sixth modification as well, an advantageous effect similar to that of the fifth modification can be obtained. Further, the pad P1 is in contact with the first transparent conductive layer TC1 and the first transparent conductive layer TC1 is in contact with the second transparent conductive layer TC2, and these are electrically connected to each other. The connecting material C is brought into contact with the second transparent conductive layer TC2 in the hole VE2. Therefore, the contact area between the pad P1 and the connecting material C can be substantially further expanded. As a result, stable electrical characteristics can be obtained.

(Seventh Modification)

Figure 15:
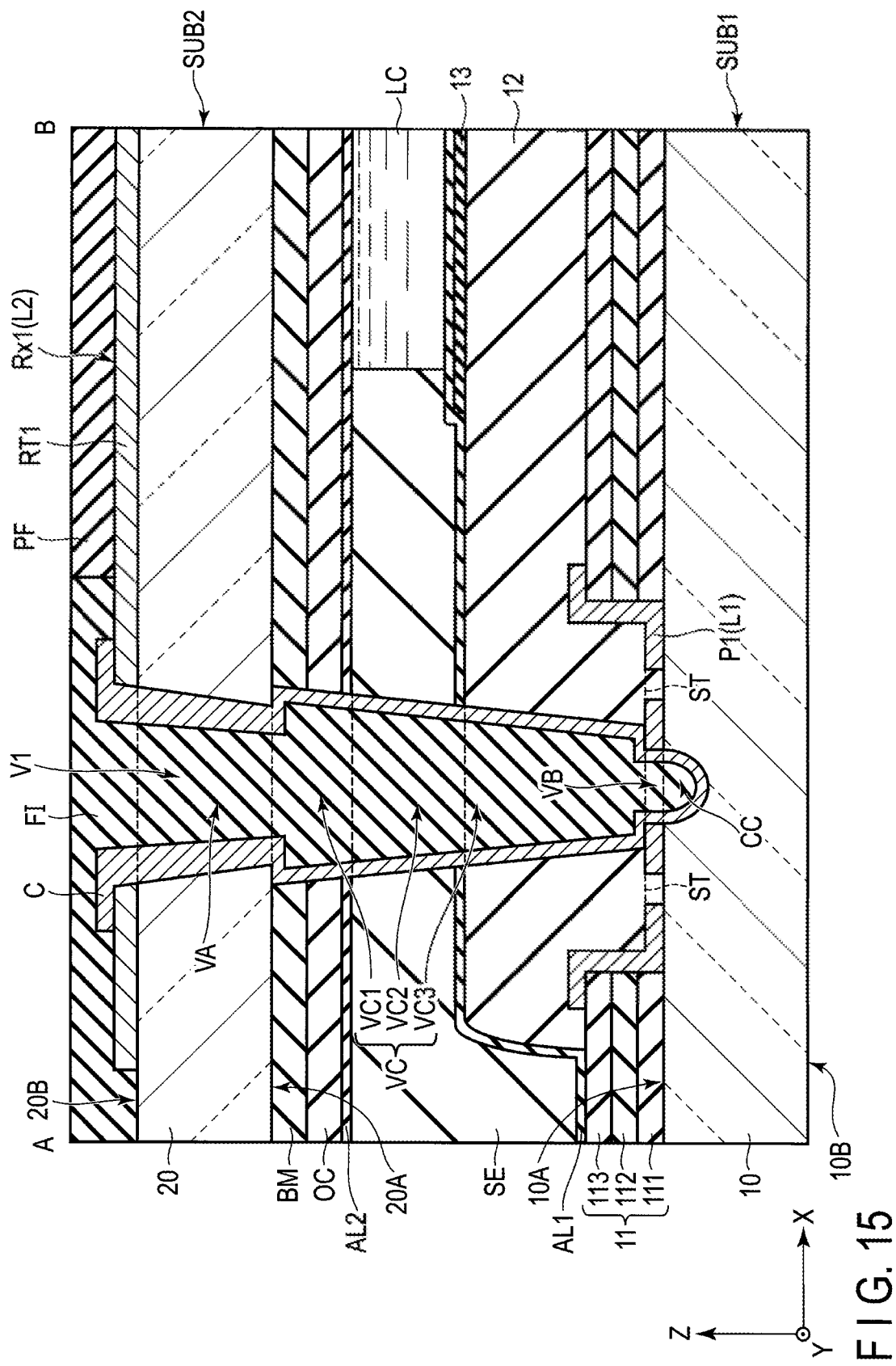
FIG. 15 is a cross section showing a seventh modification of the display device according to this embodiment.

FIG. 15 shows the seventh modification of the display device DSP according to this embodiment. In the seventh modification, the pad P1 corresponding to the first conductive layer L1 is covered by the insulating layer 12 (second organic insulating layer) formed from an organic material.

The hole VC includes a first part VC1 penetrating the light shielding layer BM, the overcoat layer OC and the second alignment film AL2, which correspond to the first organic insulating layer, a second part VC2 penetrating the sealant SE, and a third part VC3 penetrating the insulating layer 12 which corresponds to the second organic insulating layer. In the example illustrated, the second part VC2 penetrates the first alignment film AL1. The third part VC3, the second part VC2 and the first part VC1 are arranged along the third direction Z in this order. The third part VC3 communicates to the second part VC2 and the hole VB. The connecting material C is in contact with the upper surface P1A of the pad P1 in the third part VC3. Further, the connecting material C is in contact with the concavity CC via the hole VB.

(Eighth Modification)

Figure 16:
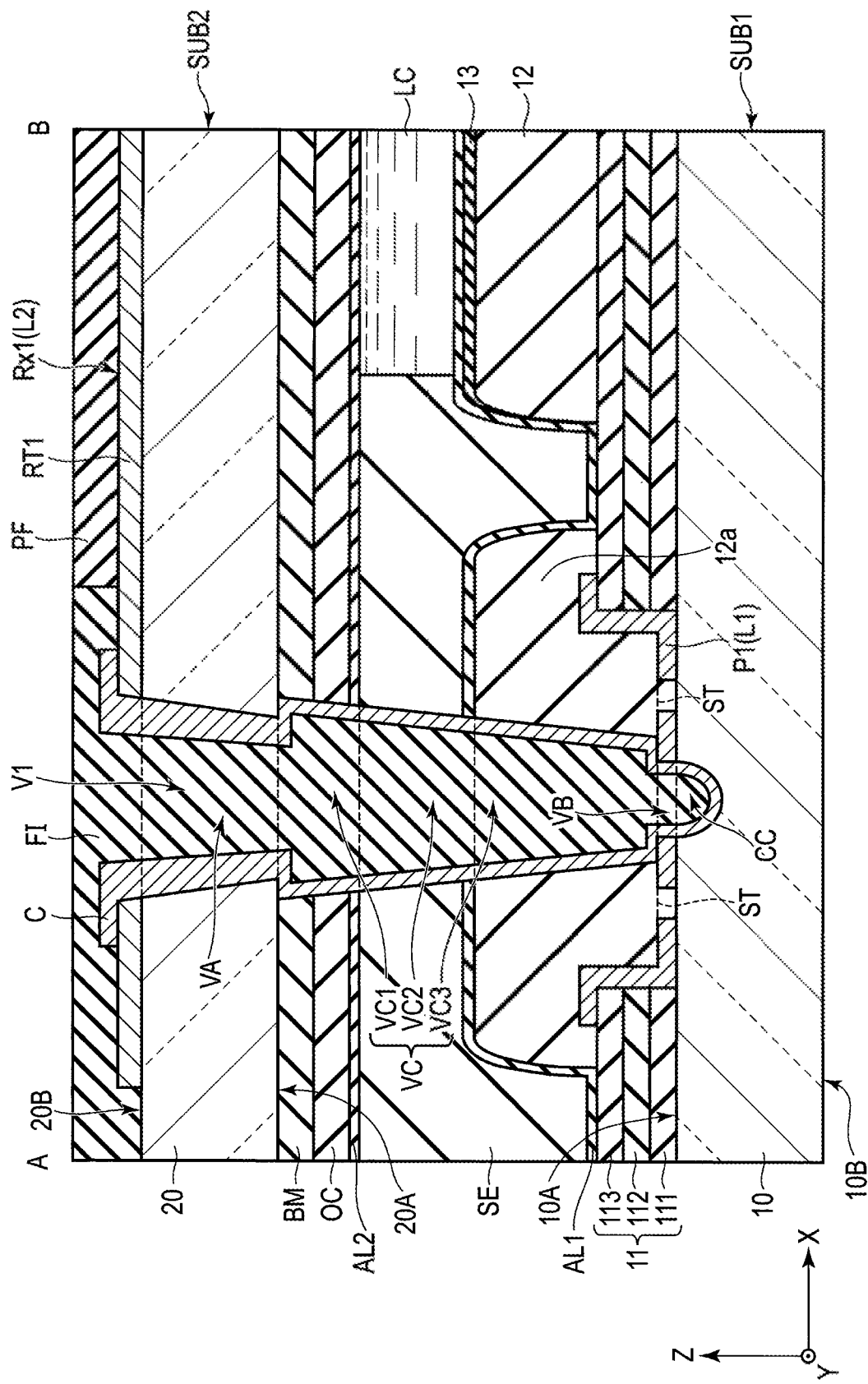
FIG. 16 is a cross section showing an eighth modification of the display device according to this embodiment.

FIG. 16 shows the eighth modification of the display device DSP according to this embodiment. In the eighth modification, the pad P1 is covered by an island-shaped insulating layer 12a. The island-shaped insulating layer 12a is formed from the same material as that of the insulating layer 12 described above, but the island-shaped insulating layer 12a which covers the pad P1 is spaced from the insulating layer 12 provided on a display area DA side.

According to the eighth modification, the island-shaped insulating layer 12a and the insulating layer 12 are separated from each other, and therefore it is possible to suppress the entering of moisture from the insulating layer 12a to the display area DA through the insulating layer 12. As a result, degradation of various elements provided in the display area DA can be suppressed.

(Ninth Modification)

Figure 17:
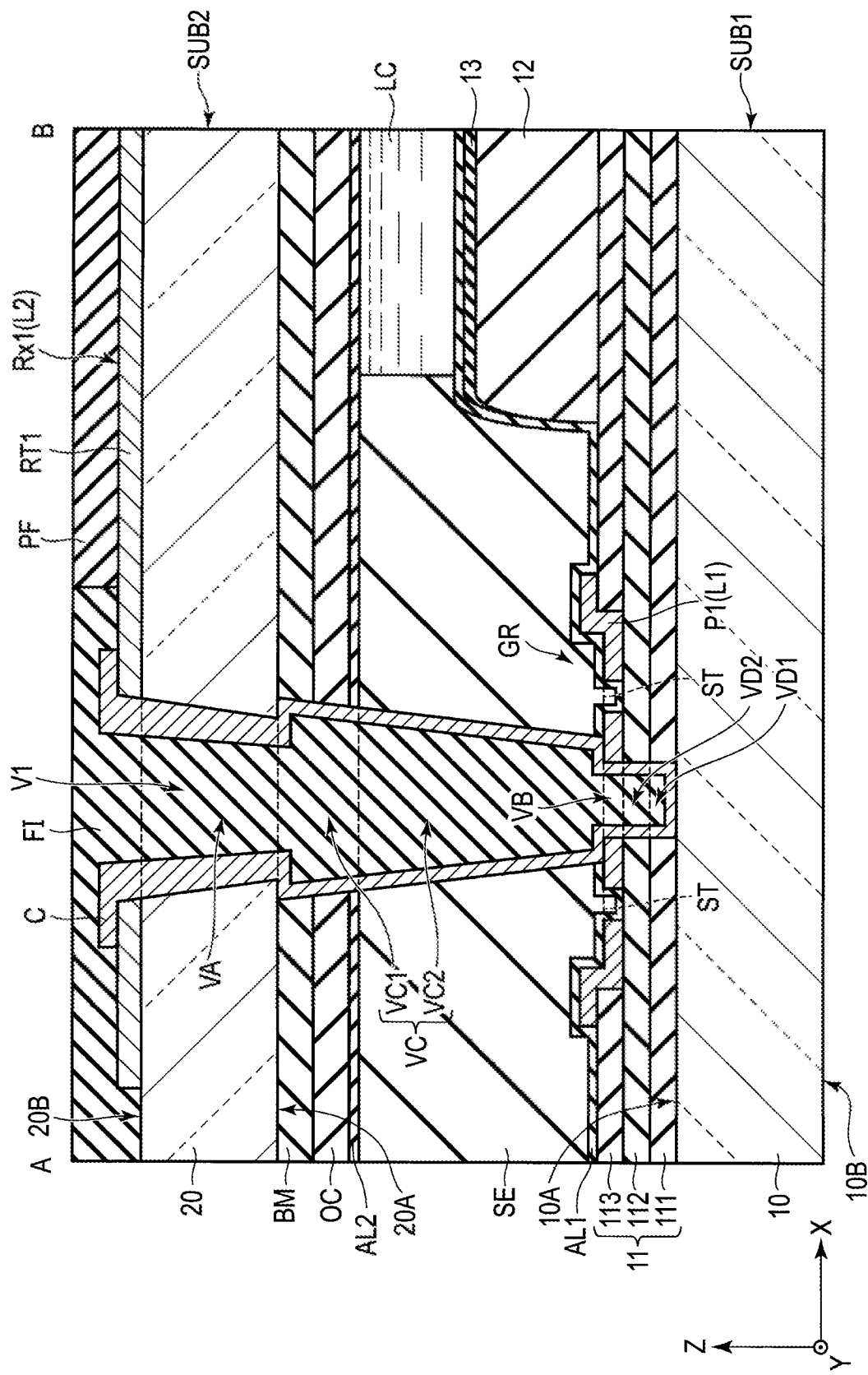
FIG. 17 is a cross section showing a ninth modification of the display device according to this embodiment.

FIG. 17 shows the ninth modification of the display device DSP according to this embodiment. In the ninth modification, no concavity is formed in the first basement 10. In the example illustrated, the pad P1 is formed on the second insulating layer 112. The contact hole V1 comprises a hole VA penetrating the second basement 20, a hole VC penetrating the organic material-made structure, a hole VB penetrating the pad P1, a hole VD2 penetrating the second insulating layer 112 and a hole VD1 penetrating the first insulating layer 111.

The connecting material C is in contact with the first insulating layer 111 and the surface 10A of the first basement 10 in the hole VD1.

(Tenth Modification)

Figure 18:
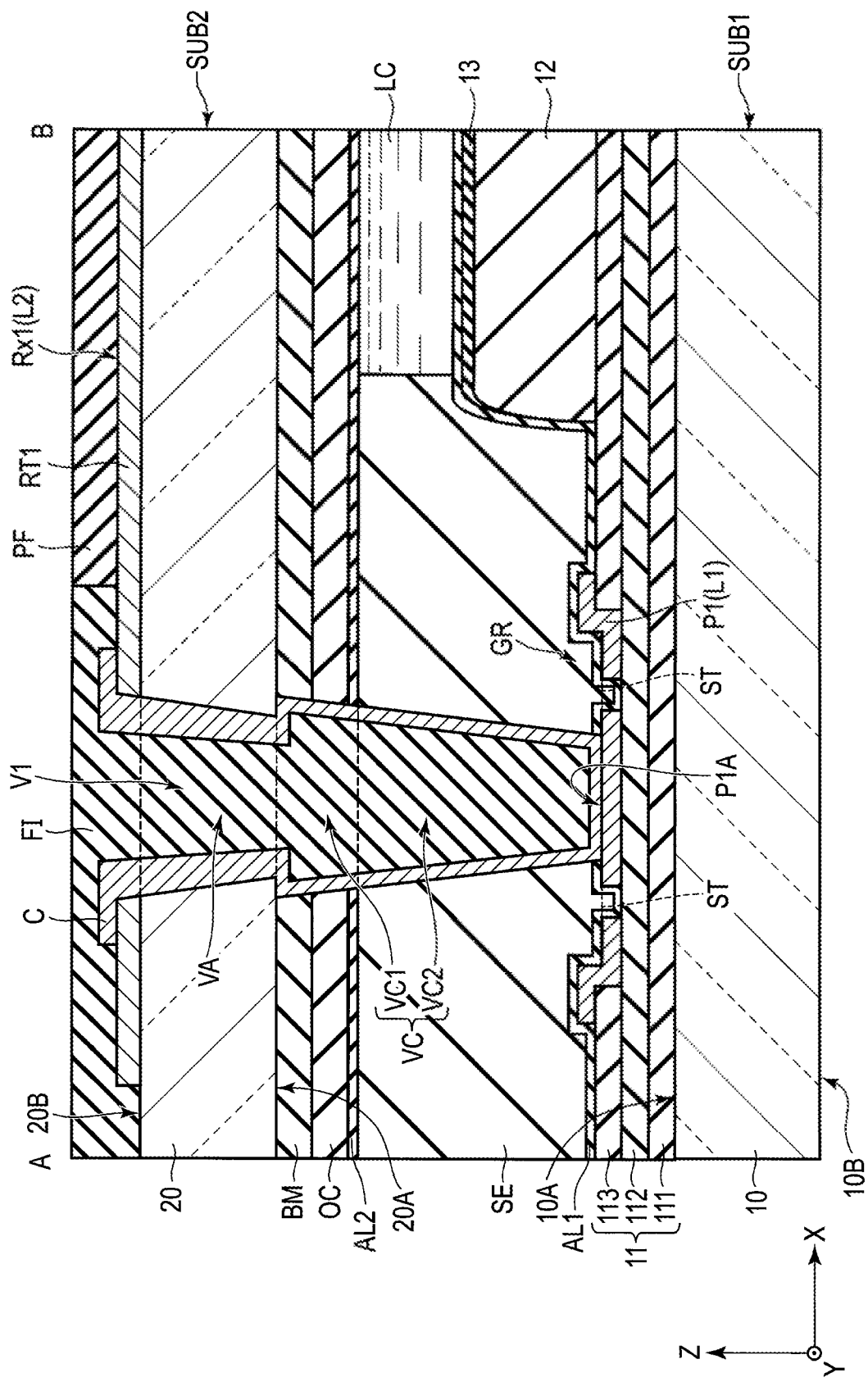
FIG. 18 is a cross section showing a tenth modification of the display device according to this embodiment.

FIG. 18 shows the tenth modification of the display device DSP according to this embodiment. In the tenth modification, no hole is formed in the pad P1 as the first conductive layer L1, the second insulating layer 112 or the first insulating layer 111. Further, no concavity is formed in the first basement 10. In the example illustrated, the pad P1 is formed on the second insulating layer 112. The contact hole V1 comprises a hole VA penetrating the second basement 20, and a hole VC penetrating the organic material-made structure. The hole VC penetrates the first alignment film AL1 as well.

The connecting material C is in contact with the sealant SE and the first alignment film AL1 in the second part VC2 of the hole VC, and also in contact with the upper surface P1A of the pad P1.

According to the tenth modification, the contact area between the connecting material C and the pad P1 can be expanded. As a result, stable electrical characteristics can be obtained.

In each of the embodiments described above, the wiring line W1 arranged in the non-display area NDA and electrically connected to the pad P1 may be formed, for example, on the third insulating layer 113, if the pad P1 is formed on any of the first basement 10, the first insulating layer 111, the second insulating layer 112, the third insulating layer 113 and the semiconductor layer SC. Or the wiring line W1 and the pad P1 may be formed on the same insulating material. That is, when the pad P1 is formed on the first basement 10, the wiring line W1 may be formed on the first basement 10, or when the pad P1 is formed on the first insulating layer 111, the wiring line W1 may be formed on the first insulating layer 111, or when the pad P1 is formed on the second insulating layer 112, the wiring line W1 may be formed on the second insulating layer 112. Moreover, the wiring line W1 may be formed from the same material as that of the signal lines S, or that of the scanning lines G, or that of the metal layer M shown in FIG. 3, for example.

In each of the embodiments described above, the hole VA corresponds the first hole, the hole VC corresponds to the second hole, the hole VB corresponds to the third hole, the hole VE1 corresponds to the fourth hole, and the hole VE2 corresponds to the fifth hole.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a first substrate including a first basement, a scanning line and a signal line, arranged in a display area which displays images, a switching element arranged in the display area and electrically connected to the scanning line and the signal line, and a first conductive layer arranged in a periphery region surrounding the display area and formed from a material different from that of the scanning line;
a second substrate including a second basement opposing the first conductive layer and spaced therefrom, and a second conductive layer, and comprising a first hole which penetrates the second basement; and
a connecting material electrically connecting the first conductive layer and the second conductive layer via the first hole,
wherein the first conductive layer comprises a slit.

2. The display device of claim 1, wherein the first conductive layer is in contact with a surface of the first basement, which opposes the second substrate.

3. The display device of claim 1, wherein
the first substrate comprises a first insulating layer formed on a surface of the first basement, which opposes the second substrate, and
the first conductive layer is in contact with the first insulating layer.

4. The display device of claim 1, wherein
the first substrate comprises a second insulating layer which covers a semiconductor layer of the switching element, and
the first conductive layer is in contact with the second insulating layer.

5. The display device of claim 1, wherein
the first substrate comprises a third insulating layer which covers the scanning line, and
the first conductive layer is in contact with the third insulating layer.

6. The display device of claim 1, wherein
the first substrate comprises a semiconductor layer formed from a same material as that of a semiconductor layer of the switching element, and
the first conductive layer is in contact with the semiconductor layer.

7. The display device of claim 1, further comprising a structure formed from an organic material provided between the first substrate and the second substrate, wherein
the structure comprises a second hole communicating to the first hole, and
the connecting material passes through the second hole.

8. The display device of claim 7, wherein
the structure includes a first organic insulating layer provided in the second substrate, and a sealant provided between the first organic insulating layer and the first substrate, and
the second hole comprises a first part penetrating the first organic insulating layer and a second part penetrating the sealant and communicating the first part.

9. The display device of claim 8, wherein
the structure is formed from a same material as that of an insulating layer which covers the signal line and includes a second organic insulating layer, and
the second hole includes a third part penetrating the second organic insulating layer and communicating to the second part.

10. The display device of claim 9, wherein
the structure includes an alignment film formed on the second organic insulating layer, and
the second hole penetrates the alignment film.

11. The display device of claim 9, wherein the second organic insulating layer is formed into an island-like shape.

12. The display device of claim 7, wherein
the first conductive layer comprises a third hole communicating to the second hole, and
the connecting material is in contact with a side surface of the first conductive layer in the third hole.

13. The display device of claim 12, wherein
the slit communicates to the third hole.

14. The display device of claim 12, wherein
the second hole has a width greater than that of the third hole, and
the connecting material is in contact with an upper surface of the first conductive layer in the second hole.

15. The display device of claim 7, further comprising:
a first transparent conductive layer which covers the first conductive layer.

16. The display device of claim 15, wherein
the first transparent conductive layer comprises a fourth hole communicating to the second hole, and
the connecting material is in contact with an upper surface of the first transparent conductive layer in the second hole and is in contact with a side surface of the first transparent conductive layer in the fourth hole.

17. The display device of claim 15, further comprising:
a second transparent conductive layer which covers the first transparent conductive layer.

18. The display device of claim 17, wherein
the second transparent conductive layer comprises a fifth hole communicating to the second hole, and
the connecting material is in contact with an upper surface of the second transparent conductive layer in the second hole and is in contact with a side surface of the second transparent conductive layer in the fifth hole.

19. The display device of claim 1, wherein
the first substrate comprises a concavity in a position opposing the first hole, and
the connecting material is in contact with the concavity.

* * * * *